US012563769B2

(12) United States Patent
Lee et al.

(10) Patent No.: US 12,563,769 B2
(45) Date of Patent: Feb. 24, 2026

(54) SEMICONDUCTOR DEVICE WITH A FIN-SHAPED ACTIVE REGION AND AN GATE ELECTRODE

(71) Applicant: Samsung Electronics Co., Ltd., Suwon-si (KR)

(72) Inventors: Jae-Hoon Lee, Suwon-si (KR); Gi-gwan Park, Hwaseong-si (KR); Tae-young Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/660,809

(22) Filed: May 10, 2024

(65) Prior Publication Data

US 2024/0290888 A1 Aug. 29, 2024

Related U.S. Application Data

(63) Continuation of application No. 17/315,818, filed on May 10, 2021, now Pat. No. 12,015,086, which is a (Continued)

(30) Foreign Application Priority Data

Jan. 22, 2016 (KR) ........................ 10-2016-0008037

(51) Int. Cl.
*H10D 30/62* (2025.01)
*H10D 30/01* (2025.01)
(Continued)

(52) U.S. Cl.
CPC ....... *H10D 30/6211* (2025.01); *H10D 30/024* (2025.01); *H10D 30/62* (2025.01); (Continued)

(58) Field of Classification Search
CPC .............. H10D 30/6211; H10D 30/62; H10D 62/8164; H10D 62/86; H10D 62/85; H10D 62/402
(Continued)

(56) References Cited

U.S. PATENT DOCUMENTS 7,834,456 B2 11/2010 Tabatabaie et al.
7,851,884 B2 12/2010 Asai et al.
(Continued)

FOREIGN PATENT DOCUMENTS

KR 10-2014-0122096 A 10/2014
KR 10-2015-0056307 A 5/2015
(Continued)

OTHER PUBLICATIONS

Korean office action dated Nov. 21, 2022 for corresponding KR Patent Application No. 10-2016-0008037.
(Continued)

*Primary Examiner* — Jami Valentine Miller
(74) *Attorney, Agent, or Firm* — Harness, Dickey & Pierce, P.L.C.

(57) ABSTRACT

A semiconductor device includes a substrate including a fin-shaped active region that protrudes from the substrate, a gate insulating film covering a top surface and both side walls of the fin-shaped active region, a gate electrode on the top surface and the both side walls of the fin-shaped active region and covering the gate insulating film, one pair of insulating spacers on both side walls of the gate electrode, one pair of source/drain region on the fin-shaped active region and located on both sides of the gate electrode, and a lower buffer layer between the fin-shaped active region the source/drain region. The source/drain regions include a compound semiconductor material including atoms from different groups. The lower buffer layer includes a com-
(Continued)

pound semiconductor material that is amorphous and includes atoms from different groups.

20 Claims, 39 Drawing Sheets

Related U.S. Application Data continuation of application No. 16/416,725, filed on May 20, 2019, now Pat. No. 11,038,062, which is a continuation of application No. 15/404,697, filed on Jan. 12, 2017, now Pat. No. 10,361,309.

(51) Int. Cl.

| | |
|---|---|
| *H10D 30/69* | (2025.01) |
| *H10D 62/13* | (2025.01) |
| *H10D 62/40* | (2025.01) |
| *H10D 62/815* | (2025.01) |
| *H10D 62/82* | (2025.01) |
| *H10D 62/832* | (2025.01) |
| *H10D 62/85* | (2025.01) |
| *H10D 62/86* | (2025.01) |

(52) U.S. Cl.
CPC ....... *H10D 30/6213* (2025.01); *H10D 30/797* (2025.01); *H10D 62/151* (2025.01); *H10D 62/402* (2025.01); *H10D 62/8164* (2025.01); *H10D 62/82* (2025.01); *H10D 62/8325* (2025.01); *H10D 62/85* (2025.01); *H10D 62/86* (2025.01)

(58) Field of Classification Search
USPC ......................................................... 257/20
See application file for complete search history.

(56) References Cited

U.S. PATENT DOCUMENTS

| | | | |
|---|---|---|---|
| 8,242,555 | B2 | 8/2012 | Hanafi |
| 8,450,775 | B2 | 5/2013 | Chong et al. |
| 8,492,261 | B2 | 7/2013 | Van Hove et al. |
| 8,643,108 | B2 | 2/2014 | Rahim et al. |
| 9,006,705 | B2 | 4/2015 | Eneman et al. |
| 9,054,189 | B1 | 6/2015 | Kim et al. |
| 9,093,422 | B2 * | 7/2015 | Kim .................. H10D 30/0245 |
| 9,117,791 | B2 | 8/2015 | Glass et al. |
| 9,129,827 | B2 | 9/2015 | Cappellani et al. |
| 9,153,585 | B2 | 10/2015 | Xiao |
| 9,153,692 | B2 | 10/2015 | Kim et al. |
| 9,287,401 | B2 * | 3/2016 | Lee .................. H01L 21/02271 |
| 9,293,534 | B2 | 3/2016 | Tsai et al. |
| 9,425,259 | B1 * | 8/2016 | Suk ..................... H10D 62/121 |
| 9,634,084 | B1 * | 4/2017 | Sheraw ............ H01L 21/02639 |
| 2005/0093082 | A1 * | 5/2005 | Son ...................... H10D 84/038 |
| | | | 257/E27.111 |
| 2005/0272190 | A1 * | 12/2005 | Lee ...................... H10D 30/024 |
| | | | 438/176 |
| 2010/0252862 | A1 * | 10/2010 | Ko ....................... H10D 30/024 |
| | | | 257/E29.081 |
| 2011/0068407 | A1 | 3/2011 | Yeh et al. |
| 2014/0175376 | A1 | 6/2014 | Avci et al. |
| 2015/0102431 | A1 * | 4/2015 | Chi .................. H01L 21/28185 |
| | | | 257/411 |
| 2015/0187770 | A1 | 7/2015 | Mehrotra et al. |
| 2015/0187773 | A1 | 7/2015 | Niimi et al. |
| 2015/0228755 | A1 | 8/2015 | Wei et al. |
| 2015/0295084 | A1 * | 10/2015 | Obradovic .......... H10D 30/794 |
| | | | 257/347 |
| 2015/0303282 | A1 | 10/2015 | Morin et al. |
| 2015/0311341 | A1 | 10/2015 | Hur et al. |
| 2016/0218181 | A1 * | 7/2016 | Yang ............... H01L 21/02532 |
| 2020/0365586 | A1 * | 11/2020 | Shin ...................... H10D 30/62 |
| 2021/0265503 | A1 * | 8/2021 | Lee ........................ H10D 30/62 |
| 2023/0402459 | A1 * | 12/2023 | Jeong .................. H10D 64/017 |

FOREIGN PATENT DOCUMENTS

| | | |
|---|---|---|
| KR | 10-2015-0082027 A | 7/2015 |
| KR | 10-2015-0110284 A | 10/2015 |

OTHER PUBLICATIONS

2 Korean Notice of Allowance dated Mar. 30, 2023 for corresponding KR Patent Application No. 10-2016-0008037.

* cited by examiner

C - C'

C – C'

B - B'

C – C'

C – C'

C – C'

C – C'

C - C'

C – C'

C - C'

C – C'

C – C'

112P —

110-1 —

B – B'

Z

Y ⊗——→ X

112 —

110-1 —

TNa

B – B'

Z

Y ⊗ — X

B – B'

B - B'

110-3

B – B'

Z

Y ⊗ ⟶ X

B - B'

B – B'

SEMICONDUCTOR DEVICE WITH A FIN-SHAPED ACTIVE REGION AND AN GATE ELECTRODE

CROSS-REFERENCE TO RELATED APPLICATION

This is a continuation of U.S. application Ser. No. 17/315,818, filed on May 10, 2021, which is a continuation application of U.S. application Ser. No. 16/416,725, filed on May 20, 2019, which claims priority under 35 U.S.C. § 120 to U.S. patent application Ser. No. 15/404,697, filed Jan. 12, 2017, which claims priority under 35 U.S.C. § 119 to Korean Patent Application No. 10-2016-0008037, filed on Jan. 22, 2016, in the Korean Intellectual Property Office, the entire contents of each of which are incorporated herein by reference.

BACKGROUND

The present disclosure relates to a semiconductor device, and more particularly, to a semiconductor device including a fin-shaped active region that protrudes from a substrate.

With the progress of electronic technology, a semiconductor device is required to have a high integration degree and a high operation speed. Accordingly, a semiconductor device that includes a fin-shaped active region and applies a strain on the fin-shaped active region in order to increase an operation speed has been developed.

SUMMARY

Inventive concepts relate to a semiconductor device having a high integration degree and a high operation speed.

According to example embodiments of inventive concepts, a semiconductor device includes a substrate including a fin-shaped active region that protrudes from the substrate; a gate insulating film covering a top surface and both side walls of the fin-shaped active region; a gate electrode on the top surface and the both side walls of the fin-shaped active region, the gate electrode covering the gate insulating film; one pair of insulating spacers on both side walls of the gate electrode; one pair of source/drain regions on the fin-shaped active region; and a lower buffer layer between the fin-shaped active region and the source/drain regions. The one pair of source/drain region are located on both sides of the gate electrode. The one pair of source/drain regions include a compound semiconductor material including atoms from different groups. The lower buffer layer includes a compound semiconductor material that is amorphous and includes atoms from different groups.

According to example embodiments of inventive concepts, a semiconductor device includes: a substrate including a first region and a second region that each include a fin-shaped active region that protrudes from the substrate, the fin-shaped active region including a group IV semiconductor material; a gate insulating film covering a top surface and both side walls of the fin-shaped active region in each of the first region and the second region; a gate electrode on the top surface and the both side walls of the fin-shaped active region and covering the gate insulating film in each of the first region and the second region; one pair of insulating spacers on both side walls of the gate insulating film and the gate electrode in each of the first region and the second region; one pair of first source/drain regions on the substrate, the one pair of first source/drain regions including a group III-V compound semiconductor material or a group II-VI compound semiconductor material having a lattice constant that is higher than a lattice constant of the group IV semiconductor material of the fin-shaped active region; one pair of second source/drain regions on the substrate, located on both sides of the gate electrode in the second region, the one pair of second source/drain regions including a group IV semiconductor material; and a buffer layer located between the fin-shaped active region and the one pair of first source/drain regions, the buffer layer an upper buffer layer on a lower buffer layer, the lower buffer layer including a group III-V compound semiconductor material or a group II-VI compound semiconductor material that is amorphous, and the upper buffer layer including a compound semiconductor material including first atoms and second atoms from different groups, the second atoms have greater atomic radii than the first atoms, a ratio of the first atoms to the second atoms decreases from bottom to top of the upper buffer layer.

According to example embodiments a semiconductor device includes a fin-shaped active region that extends in a first direction; a source region and a drain region spaced apart from each other on the fin-shaped active region, the source region and the drain region including a compound semiconductor material including atoms from different groups; a lower buffer layer between the fin-shaped active region and the source region and the drain region, the lower buffer layer including a compound semiconductor material that is amorphous and includes atoms from different groups; and a gate structure on a portion of the fin-shaped active region between the source region and the drain region. The gate structure extends in a second direction that crosses the first direction.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Inventive concepts will now be described more fully with reference to the accompanying drawings, in which some example embodiments of inventive concepts are shown.

Figure 1A:
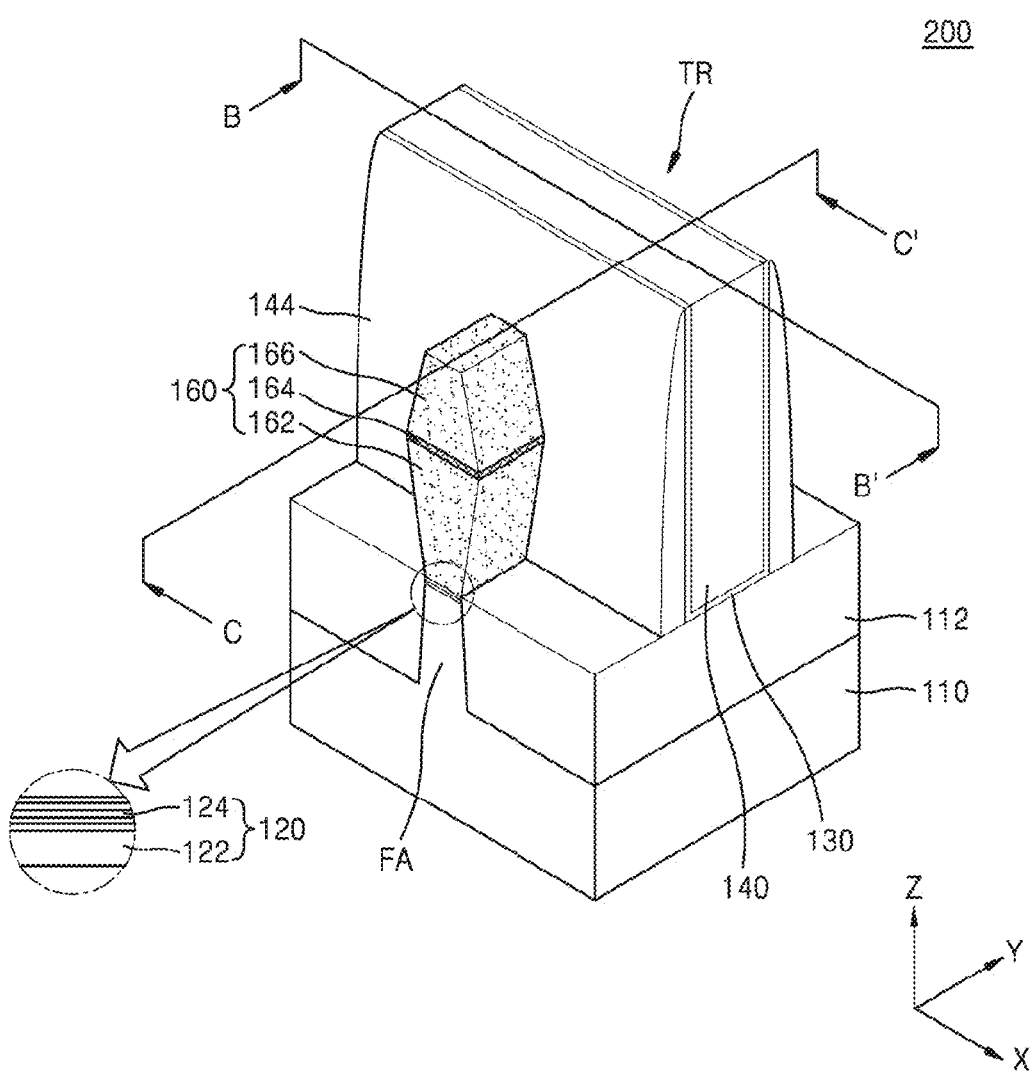
FIGS. 1A through 1C are a perspective view and cross-sectional views illustrating elements of a semiconductor device according to an embodiment.
Figure 1B:
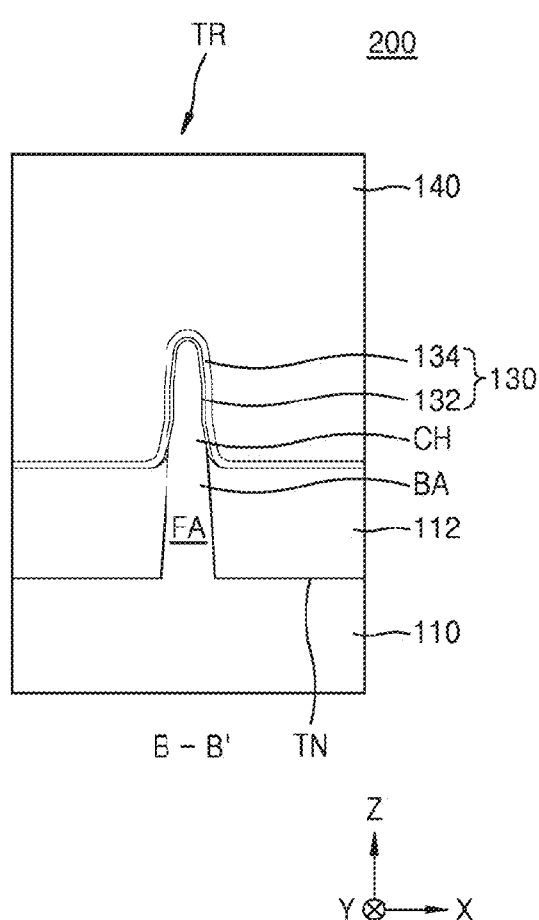
Figure 1C:
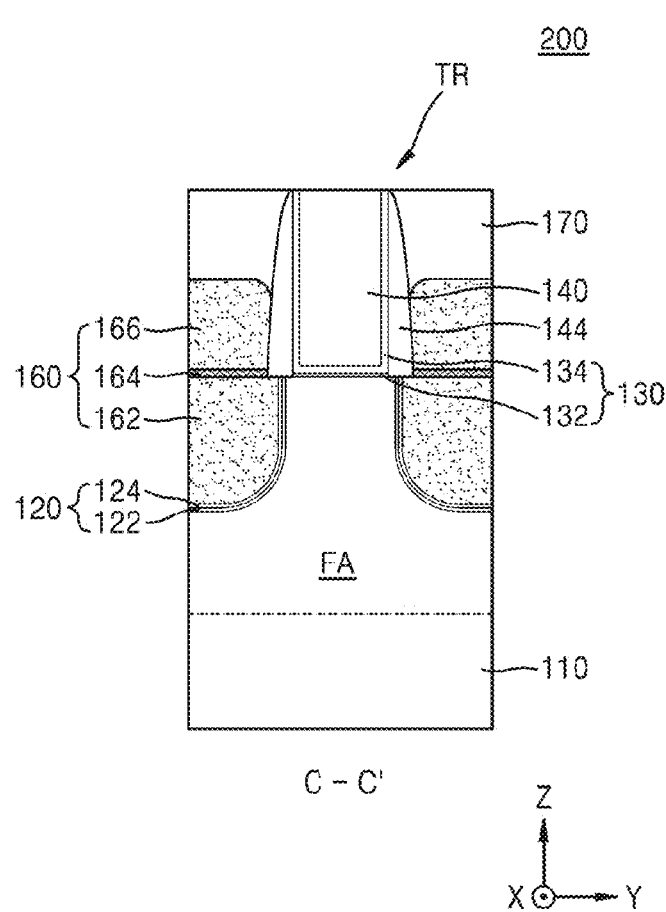

FIGS. 1A through 1C are a perspective view and cross-sectional views illustrating elements of a semiconductor device 200 according to an embodiment. FIG. 1A is a perspective view illustrating elements of the semiconductor device 200 including a transistor having a fin field effect transistor (FinFET) structure. FIG. 1B is a cross-sectional view taken along line B-B' of FIG. 1A. FIG. 1C is a cross-sectional view taken along line C-C' of FIG. 1A.

Referring to FIGS. 1A through 1C, the semiconductor device 200 includes a fin-shaped active region FA that protrudes from a substrate 110 in a direction (e.g., a Z direction) perpendicular to a main surface of the substrate 110.

The substrate 110 may include a semiconductor material. The substrate 110 may be formed of at least one of a group III-V material and a group IV material. The substrate 110 may include, for example, silicon (Si). Alternatively, the substrate 110 may include a semiconductor element such as germanium (Ge), or a compound semiconductor material such as silicon germanium (SiGe), silicon carbide (SiC), gallium arsenide (GaAs), indium arsenide (InAs), or indium phosphide (InP). The group III-V material may be a binary, ternary, or quaternary compound including at least one group III element and at least one group V element. The group III-V material may be a compound including at least one of indium (In), gallium (Ga), and aluminum (Al) as a group III element and at least one of arsenic (As), phosphorus (P), and antimony (Sb) as a group V element. For example, the group III-V material may be selected from InP, $In_zGa_{1-z}As$ ($0 \leq z \leq 1$), and $Al_zGa_{1-z}As$ ($0 \leq z \leq 1$). The binary compound may be any one of, for example, InP, GaAs, InAs, InSb, and GaSb. The ternary compound may be any one of, for example, InGaP, InGaAs, AlInAs, InGaSb, GaAsSb, and GaAsP. The group IV material may be Si or Ge. However, the group III-V material and the group IV material that may be used in the semiconductor device 200 are not limited to the above materials. The group III-V material and the group IV material such as Ge may be used as a channel material for obtaining a low-power, high-speed transistor. A high-performance complementary metal-oxide-semiconductor (CMOS) may be formed by using a semiconductor substrate formed of a group III-V material, for example, GaAs, having a higher electron mobility than a Si substrate, and a semiconductor substrate formed of a semiconductor material, for example, Ge, having a higher hole mobility than the Si substrate. In some embodiments, when an NMOS transistor is formed on the substrate 110, the substrate 110 may be formed of any one of the above group III-V materials. In other embodiments, when a PMOS transistor is formed on the substrate 110, at least a part of the substrate 110 may be formed of Ge. In some embodiments, the substrate 110 may have a silicon-on-insulator (SOI) structure or a germanium-on-insulator (GOI) structure. For example, the substrate 110 may include a buried oxide (BOX) layer. The substrate 110 may include a conductive region, for example, a well doped with impurities. The substrate 110 may have any of various device isolation structures such as a shallow trench isolation (STI) structure or a deep trench isolation (DTI) structure.

The fin-shaped active region FA may extend in one direction (e.g., a Y direction in FIGS. 1A through 1C). The fin-shaped active region FA may be formed of the same material as a part of the substrate 110, that is, the substrate 110. A device isolation film 112 that covers side walls of a lower portion of the fin-shaped active region FA is formed on the substrate 110. The fin-shaped active region FA protrudes upward beyond a top surface of the device isolation film 112 to have a fin shape. Although one fin-shaped active region FA is illustrated in FIGS. 1A through 1C, a plurality of the fin-shaped active regions FA that extend in parallel to one another in the one direction (e.g., the Y direction) may be formed. Also, the plurality of fin-shaped active regions FA may be arranged in the one direction (e.g., the Y direction) to be spaced apart from each other by a predetermined interval.

In some embodiments, a width of an upper portion of the fin-shaped active region FA in one direction (e.g., an X direction in FIGS. 1A through 1C) may be less than a width of the lower portion of the fin-shaped active region FA. In some embodiments, an upper end of the fin-shaped active region FA may have a round shape.

The device isolation film 112 may include an insulating material. For example, the device isolation film 112 may include a silicon-containing insulating film such as a silicon oxide film, a silicon nitride film, a silicon oxynitride film, or a silicon carbonitride film, polysilicon, or a combination thereof. The device isolation film 112 may fill a lower portion of a trench TN formed in the substrate 110. The device isolation film 112 may be formed by using, but not limited to, plasma enhanced chemical vapor deposition (PECVD), high density plasma CVD (HDP CVD), inductively coupled plasma CVD (ICP CVD), capacitor coupled plasma CVD (CCP CVD), flowable chemical vapor deposition (FCVD), and/or spin coating.

In some embodiments, the device isolation film 112 may have a multi-film structure. For example, the device isolation film 112 may include first and second liners sequentially stacked on an inner wall of the trench TN and a buried insulating film formed on the second liner. The first liner may include, for example, an oxide such as silicon oxide, and the second liner may include, for example, polysilicon or a nitride such as silicon nitride. The buried insulating film may include, for example, an oxide such as silicon oxide.

The fin-shaped active region FA may have a channel portion CH, and a base portion BA that is disposed under the channel portion CH and has both side walls covered by the device isolation film 112. In some embodiments, the channel portion CH of the fin-shaped active region FA may be formed of a single material. For example, all portions of the fin-shaped active region FA including the channel portion CH may be formed of Si. In other embodiments, a part of the fin-shaped active region FA may be formed of Ge and another part of the fin-shaped active region FA may be formed of Si.

A gate insulating film 130 may be formed to cover a top surface and both side walls of the fin-shaped active region FA. A gate electrode 140 may be formed over the top surface and the both side walls of the fin-shaped active region FA to cover the gate insulating film 130. The gate electrode 140 may extend in one direction (e.g., the X direction in FIGS. 1A through 1C). The direction (e.g., the X direction) in which the gate electrode 140 extends may be perpendicular to a direction in which the fin-shaped active region FA extends.

The gate insulating film 130 may be formed of silicon oxide, silicon nitride, silicon oxynitride, gallium oxide, germanium oxide, a high-k dielectric material, or a combination thereof.

The gate insulating film 130 may include an interface film 132 having a first relative dielectric constant and a high-k dielectric film 134 formed on the interface film 132 and having a second relative dielectric constant higher than the first relative dielectric constant. The interface film 132 of the semiconductor device 200 may be formed between the top surface and the both side walls of the fin-shaped active region FA and a bottom surface of the gate electrode 140 to face the bottom surface of the gate electrode 140, and the high-k dielectric film 134 may be formed to face the bottom surface and both side walls of the gate electrode 140.

The interface film 132 may be formed of a low-k dielectric material having a relative dielectric constant of about 9 or less, for example, but not limited to, silicon oxide, silicon nitride, silicon oxynitride, gallium oxide, or germanium oxide. The interface film 132 may be an oxide, a nitride, or an oxynitride of a material of the substrate 110. The interface film 132 may have a thickness ranging, but not limited to, from about 5 Å to about 20 Å. The interface film 132 may be formed by using thermal oxidation, atomic layer deposition (ALD), CVD, or physical vapor deposition (PVD).

The high-k dielectric film 134 may be formed of a high-k dielectric material having a relative dielectric constant ranging from about 10 to about 25 that is higher than that of the interface film 132. The high-k dielectric film 134 may be formed of a material having a relative dielectric constant higher than that of, for example, a silicon oxide film or a silicon nitride film. The high-k dielectric film 134 may be formed of a material selected from among, but not limited to, hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof. The high-k dielectric film 134 may be formed by using ALD, CVD, or PVD. The high-k dielectric film 134 may have a thickness ranging, for example, but not limited to, from about 10 Å to about 40 Å.

The gate electrode 140 may be formed of at least one metal selected from among, for example, titanium (Ti), tantalum (Ta), aluminum (Al), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), a metal nitride including at least one metal, or a metal compound such as a carbon-doped metal or a carbon-doped metal nitride.

The gate electrode 140 may include a single film or may have a multi-film structure including a plurality of films. The gate electrode 140 may include, for example, a work function adjusting metal-containing layer and a gap filling metal-containing layer that fills a space formed over the work function adjusting metal-containing layer.

In some embodiments, the gate electrode 140 may have a structure in which a metal nitride layer, a metal layer, a conductive capping layer, and a gap-fill metal film are sequentially stacked. Each of the metal nitride layer and the metal layer may include at least one metal atoms selected from among Ti, W, Ru, Nb, Mo, Hf, Ni, Co, Pt, Yb, Tb, Dy, Er, and Pd. Each of the metal nitride layer and the metal layer may be formed by using ALD, metal organic ALD (MOALD), or metal organic CVD (MOCVD). The conductive capping layer may function as a protective film for limiting and/or preventing a surface of the metal layer from being oxidized. Also, the conductive capping layer may function as a wetting layer for easily depositing another conductive layer on the metal layer. The conductive capping layer may be formed of, but not limited to, a metal nitride such as TiN, TaN, or a combination thereof. The gap-fill metal film may extend over the conductive capping layer. The gap-fill metal film may be a W film. The gap-fill metal film may be formed by using ALD, CVD, or PVD. The gap-fill metal film may cover a recess space formed by a stepped portion between regions on a top surface of the conductive capping layer without voids. In some embodiments, the gate electrode 140 may have a TiAlC/TiN/W stacked structure, a TiN/TaN/TiAlC/TiN/W stacked structure, or a TiN/TaN/TiN/TiAlC/TiN/W stacked structure. In the stacked structures, a TiAlC layer or a TiN layer may function as a work function adjusting metal-containing layer.

One pair of source/drain regions 160 may be formed on portions of the fin-shaped active region FA located on both sides of the gate electrode 140. The source/drain regions 160 may include a semiconductor layer that is epitaxially grown from the fin-shaped active region FA.

The source/drain regions 160 may be formed of a material having a lattice constant that is higher than that of a material of the fin-shaped active region FA. The one pair of source/drain regions 160 may be formed of a compound semiconductor material from different groups. For example, the one pair of source/drain regions 160 may be formed of a group III-V compound semiconductor material or a group II-VI compound semiconductor material.

Although the source/drain regions 160 have a specific shape in FIGS. 1A and 1C, a cross-sectional shape of the source/drain regions 160 is not limited to that in FIGS. 1A and 1C and may be any of various other shapes.

The source/drain regions 160 may include a lower end portion 162, an upper end portion 166, and a stress-reducing layer 164 disposed between the lower end portion 162 and the upper end portion 166.

In some embodiments, the lower end portion 162 and the upper end portion 166 of the source/drain regions 160 may be formed of a group III-V compound semiconductor material that is crystalline or a group II-VI compound semiconductor material that is crystalline, having a lattice constant higher by 7.5% or more (e.g., 7.5% to 20%, but not limited thereto) than that of Si. For example, the lower end portion 162 and the upper end portion 166 may be formed of a group III-V compound semiconductor material such as GaSb, AlSb, or InP or a group II-VI compound semiconductor material such as CdSe, MgSe, ZnTe, MgTe, or GdTe. GaSb, AlSb, InP, CdSe, MgSe, ZnTe, MgTe, and CdTe may respectively have lattice constants of 6.096 Å, 6.136 Å, 5.869 Å 6.05 Å, 5.873 Å, 6.101 Å, 6.417 Å, and 6.48 Å.

The stress-reducing layer 164 may be formed of a group III-V compound semiconductor material that is amorphous or a group II-VI compound semiconductor material that is amorphous. In some embodiments, the stress-reducing layer 164 may be an amorphous layer of the same group III-V compound semiconductor material or group II-VI compound semiconductor material as that of the lower end portion 162 and the upper end portion 166. For example, the stress-reducing layer 164 may include an amorphous layer of a group III-V compound semiconductor material such as GaSb, AlSb, or InP or an amorphous layer of a group II-VI compound semiconductor material such as CdSe, MgSe, ZnTe, MgTe, or GdTe.

In some embodiments, the stress-reducing layer 164 may be formed of a superlattice of a group IV semiconductor material and a group III-V compound semiconductor material or a superlattice of a group IV semiconductor material and a group II-VI compound semiconductor material. For example, the stress-reducing layer 164 may be formed of a superlattice in which a group IV semiconductor material and a group III-V compound semiconductor material or a group IV semiconductor material and a group II-VI compound semiconductor material are stacked repeatedly, for example, tens of times. In some embodiments, the group IV semiconductor material of the superlattice of the stress-reducing layer 164 may be the same material as that of the fin-shaped active region FA. In some embodiments, the group III-V compound semiconductor material or the group II-VI compound semiconductor material of the superlattice of the stress-reducing layer 164 may be the same as that of the lower end portion 162 and the upper end portion 166. For example, the stress-reducing layer 164 may be formed of a superlattice of a group IV semiconductor material such as Si, Ge, or SiGe and a group III-V compound semiconductor material such as GaSb, AlSb, or InP, or a superlattice of a group IV semiconductor material such as Si, Ge, or SiGe and a group II-VI compound semiconductor material such as CdSe, MgSe, ZnTe, MgTe, or GdTe.

When a lattice constant of the source/drain regions 160 is higher than that of the fin-shaped active region FA, a stress due to a lattice constant difference may be accumulated in the source/drain regions 160 during a process of forming the source/drain regions 160, and thus cracks or crystal defects may occur in the source/drain regions 160. However, in the semiconductor device 200, since the stress-reducing layer 164 is disposed between the lower end portion 162 and the upper end portion 166 of the source/drain regions 160, cracks or crystal defects may be limited and/or prevented from occurring in the source/drain regions 160, thereby improving the reliability of the semiconductor device 200.

A buffer layer 120 may be formed between the fin-shaped active region FA and the source/drain regions 160, particularly, between the fin-shaped active region FA and the lower end portion 162 of the source/drain regions 160. The buffer layer 120 may reduce a lattice mismatch between the fin-shaped active region FA and the source/drain regions 160.

The buffer layer 120 may include a lower buffer layer 122 formed on the fin-shaped active region FA and an upper buffer layer 124 formed on the lower buffer layer 122.

The lower buffer layer 122 may be formed of a group III-V compound semiconductor material that is amorphous or a group II-VI compound semiconductor material that is amorphous. In some embodiments, the lower buffer layer 122 may be an amorphous layer of a material composed of (and/or including) the same atoms as those of the lower end portion 162 and the upper end portion 166 of the source/drain regions 160. In detail, the lower buffer layer 122 may be an amorphous layer of the same group III-V compound semiconductor material or group II-VI compound semiconductor material as that of the lower end portion 162 and the upper end portion 166 of the source/drain regions 160. For example, the lower buffer layer 122 may include an amorphous layer of a group III-V compound semiconductor material such as GaSb, AlSb, or InP or an amorphous layer of a group II-VI compound semiconductor material such as CdSe, MgSe, ZnTe, MgTe, or GdTe.

The upper buffer layer 124 may be formed of a group III-V compound semiconductor material or a group II-VI compound semiconductor material, and may be a grade layer in which an atomic ratio of a compound semiconductor material changes from bottom to top. In some embodiments, the upper buffer layer 124 may be formed of the same compound semiconductor material as that of the lower end portion 162 and the upper end portion 166 of the source/drain regions 160. The upper buffer layer 124 may be formed so that an overall stoichiometry is constant and a ratio between atoms of the upper buffer layer 124 changes from bottom to top. For example, from among atoms of a compound semiconductor material of the upper buffer layer 124, for example, first atoms and second atoms from different groups, a ratio of the first atoms whose atomic radii are less than those of the second atoms may decrease from bottom to top of the upper buffer layer 124 and a ratio of the second atoms whose atomic radii are greater than those of the first atoms may increase from bottom to top of the upper buffer layer 124. For example, the upper buffer layer 124 may include a multi-layer film in which a ratio between the first atoms and the second atoms is, but not limited, 90%: 10%, 80%: 20%, 70%: 30%, 50%: 50%, 30%: 70%, 20%: 80% or 10%: 90%. In other words, the ratio between the first atoms and the second atoms may be in a range from 90%: 10% to 10%: 90%. In some embodiments, the upper buffer layer 124 may be formed so that a ratio between the first atoms and the second atoms changes continuously.

The upper buffer layer 124 may reduce a lattice mismatch between the fin-shaped active region FA and the source/drain regions 160 and may improve the crystallinity of the source/drain regions 160 during a process of forming the source/drain regions 160.

A transistor TR may be formed at an intersection between the fin-shaped active region FA and the gate electrode 140. The transistor TR is a three-dimensional (3D) MOS transistor in which channels are formed on the top surface and the both side walls of the fin-shaped active region FA. The transistor TR may be an NMOS transistor or a PMOS transistor.

Insulating spacers 144 may be formed on both sides of a gate structure including the gate insulating film 130 and the gate electrode 140 sequentially formed from a surface of the fin-shaped active region FA. That is, one pair of insulating spacers 144 may be formed on both side walls of the gate insulating film 130 and the gate electrode 140. As shown in FIG. 1C, an interlayer insulating film 170 that covers the insulating spacers 144 may be formed at a side of the insulating spacers 144 opposite to the gate structure. The insulating spacers 144 may include, but not limited to a silicon nitride film, a silicon oxynitride film, a carbon-containing silicon oxynitride film, or a combination film thereof, or may have an air gap or a low-k dielectric film therein. The interlayer insulating film 170 may include, but not limited to, a silicon oxide film such as tetra ethyl ortho silicate (TEOS).

The gate insulating film 130 may be formed to cover an inner surface of a space defined between the one pair of insulating spacers 144. The gate electrode 140 may be formed to cover the gate insulating film 130 and to fill the space defined between the one pair of insulating spacers 144.

In some embodiments, the insulating spacers 144 may be a combination film including a first insulating spacer having an L-shape and a second insulating spacer formed on the first insulating spacer. In some embodiments, the second insulating spacer may be omitted, and in this case, the insulating spacers 144 may have an L-shape. In some embodiments, the insulating spacers 144 may further have an air gap in a space between the first insulating spacer and the second insulating spacer. In some embodiments, the insulating spacers 144 may be formed so that the air gap is filled with a low-k dielectric film having a relative dielectric constant lower than that of each of the first and second insulating spacers.

In some embodiments, the semiconductor device 200 may further include a nanosheet stacked structure spaced apart from the top surface of the fin-shaped active region FA to face the top surface of the fin-shaped active region FA. The nanosheet stacked structure may include a plurality of nanosheets that extend in parallel to the top surface of the fin-shaped active region FA. The plurality of nanosheets may include a channel region. The gate electrode 140 may surround at least a part of the channel region. The nanosheets may be formed of a group IV semiconductor, a group IV-IV compound semiconductor, or a group III-V compound semiconductor. For example, the nanosheets may be formed of Si, Ge, or SiGe, or may be formed of InGaAs, InAs, GaSb, InSb, or a combination thereof. When the semiconductor device 200 further includes the nanosheet stacked structure, the gate insulating film 130 may be disposed between the channel region and the gate electrode 140. The source/drain regions 160 may contact both end portions of the plurality of nanosheets, and the both end portions of the plurality of nanosheets adjacent to the source/drain regions 160 may be covered by the insulating spacers 144 that cover the side walls of the gate electrode 140. One pair of inner insulating spacers may be formed between the fin-shaped active region FA and the nanosheets. The one pair of inner insulating spacers may be disposed between the gate electrode 140 and the source/drain regions 160. The inner insulating spacers may be formed of a material different from that of the gate insulating film 130. The inner insulating spacers may be formed of a material having a dielectric constant that is lower than a dielectric constant of a material of the gate insulating film 130. For example, the inner insulating spacers may be formed of, but not limited to, an oxide of a material of the nanosheets. The gate insulating film 130 may extend from a surface of the channel region to surfaces of side walls of the inner insulating spacers to be disposed between the gate electrode 140 and the inner insulating spacers formed between the fin-shaped active region FA and the nanosheets.

In the semiconductor device 200, since the one pair of source/drain regions 160 are formed of a material having a lattice constant that is higher than that of a material of the fin-shaped active region FA, the one pair of source/drain regions 160 may apply a compressive stress to the channel portion CH of the fin-shaped active region FA, thereby increasing a mobility of carriers, particularly, holes. Accordingly, an operation speed of the transistor TR of the semiconductor device 200 may be increased.

Also, since the source/drain regions 160 include the stress-reducing layer 164 disposed between the lower end portion 162 and the upper end portion 166, cracks or crystal defects may be limited and/or prevented from occurring in the source/drain regions 160, thereby improving the reliability of the semiconductor device 200.

Also, since the buffer layer 120 is formed between the fin-shaped active region FA and the source/drain regions 160, a lattice mismatch between the fin-shaped active region FA and the source/drain regions 160 may be reduced and the crystallinity of the source/drain regions 160 may be improved during a process of forming the source/drain regions 160.

Figure 2A:
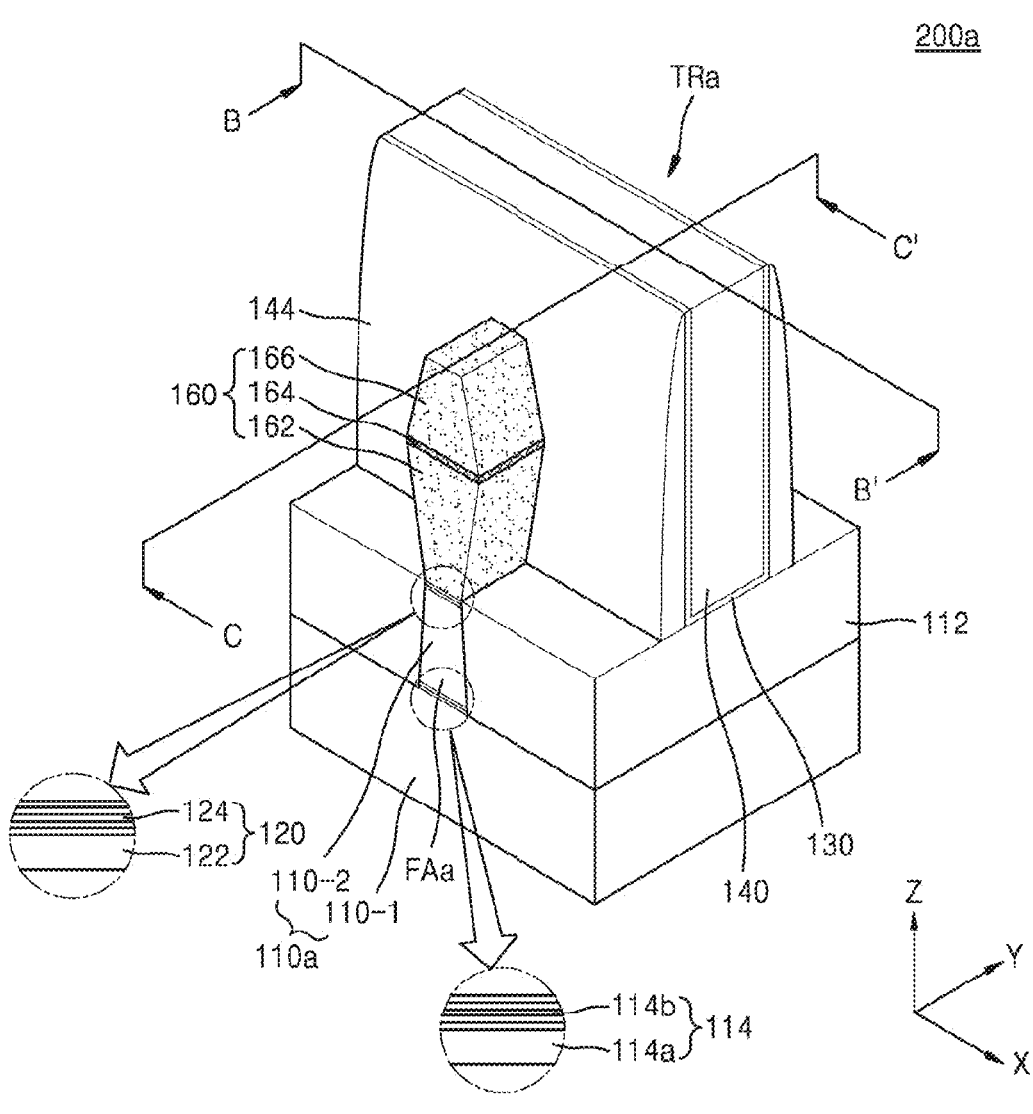
FIGS. 2A through 2C are a perspective view and cross-sectional views illustrating elements of a semiconductor device according to an embodiment.
Figure 2B:
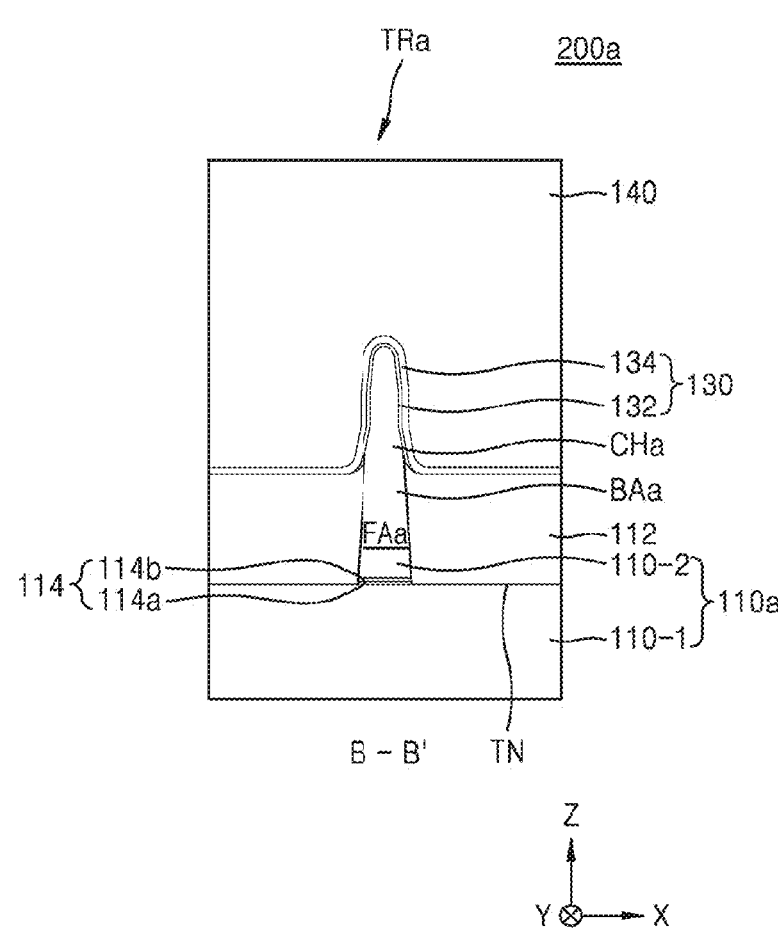
Figure 2C:
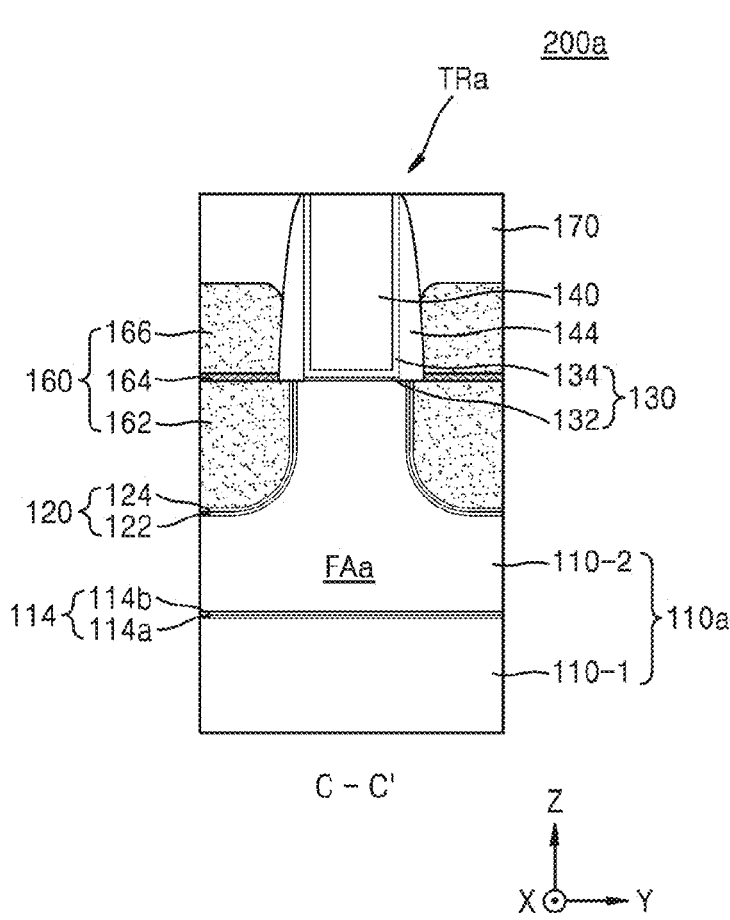

FIGS. 2A through 2C are a perspective view and cross-sectional views illustrating elements of a semiconductor device 200a according to an embodiment. FIG. 2A is a perspective view illustrating elements of the semiconductor device 200a including a transistor having a FinFET structure. FIG. 2B is a cross-sectional view taken along line B-B' of FIG. 2A.

FIG. 2C is a cross-sectional view taken along line C-C' of FIG. 2A. In FIGS. 2A through 2C, the same elements as those in FIGS. 1A through 1C are denoted by the same reference numerals, and thus a detailed explanation thereof will not be given.

Referring to FIGS. 2A through 2C, the semiconductor device 200a includes a fin-shaped active region FAa that protrudes from a substrate 110a in a direction (e.g., a Z direction) perpendicular to a main surface of the substrate 110a. The substrate 110a may include a substrate base 110-1 and a fin portion 110-2 that is formed on the substrate base 110-1.

The fin portion 110-2 may be formed by performing selective epitaxial growth (SEG) on the substrate base 110-1. The fin portion 110-2 may include a semiconductor layer that is epitaxially grown from the substrate base 110-1.

The substrate base 110-1 may be formed of a first semiconductor material and the fin portion 110-2 may be formed of a second semiconductor material. The second semiconductor material may have an electron mobility that is higher than that of the first semiconductor material. The substrate base 110-1 and the fin portion 110-2 may be formed of a group IV semiconductor material. In some embodiments, the first semiconductor material may be Si and the second semiconductor material may be Ge. The fin portion 110-2 may constitute the fin-shaped active region FAa.

The substrate 110a may further include an active buffer layer 114 that is formed between the substrate base 110-1 and the fin portion 110-2. The active buffer layer 114 may reduce a lattice mismatch between the substrate base 110-1 and the fin portion 110-2.

The active buffer layer 114 may include a lower active buffer layer 114a formed on the substrate base 110-1 and an upper active buffer layer 114b formed on the lower active buffer layer 114a.

The lower active buffer layer 114a may be formed of a group IV semiconductor material that is amorphous. In some embodiments, the lower active buffer layer 114a may be an amorphous layer of a material composed of (and/or including) the same atoms as those of the substrate base 110-1. In detail, the lower active buffer layer 114a may be an amorphous layer of the same group IV semiconductor material as that of the substrate base 110-1. For example, the lower active buffer layer 114a may be an amorphous layer of a group IV semiconductor material such as Si.

The upper active buffer layer 114b may be formed of a compound semiconductor material composed of (and/or including) atoms of the substrate base 110-1 and atoms of the fin portion 110-2. The upper active buffer layer 114b may be formed of a group IV compound semiconductor material, and may be a grade layer in which an atomic ratio of a compound semiconductor material changes from bottom to top. The upper active buffer layer 114b may be formed so that an overall stoichiometry is constant and a ratio between atoms of the upper active buffer layer 114b changes from bottom to top. For example, from among atoms of a compound semiconductor material of the upper active buffer layer 114b, for example, first atoms and second atoms from different groups, a ratio of the first atoms whose atomic radii are less than those of the second atoms may decrease from bottom to top of the upper active buffer layer 114b and a ratio of the second atoms whose atomic radii are greater than those of the first atoms may increase from bottom to top of the upper active buffer layer 114b. In some embodiments, the first atoms may be Si atoms and the second atoms may be Ge atoms. For example, the upper active buffer layer 114b may include a multi-layer film in which a ratio between the first atoms and the second atoms is, but not limited, 90%: 10%, 80%: 20%, 70%: 30%, 50%: 50%, 30%: 70%, 20%: 80% or 10%: 90%. In other words, the ration of first atoms to second atoms may be in a range from 90%: 10% to 10%: 90%. In some embodiments, the upper active buffer layer 114b may be formed so that a ratio between the first atoms and the second atoms changes continuously.

In some embodiments, the substrate base 110-1 may have a SOI structure or a GOI structure. For example, the substrate base 110-1 may include a BOX layer. The substrate base 110-1 may include a conductive region, for example, a well doped with impurities. The substrate base 110-1 may have any of various device isolation structures such as a STI structure or a DTI structure.

The fin-shaped active region FAa may extend in one direction (e.g., a Y direction in FIGS. 2A through 2C). The device isolation film 112 that covers side walls of a lower portion of the fin-shaped active region FAa is formed on the substrate base 110-1. The device isolation film 112 may fill a lower portion of the trench TN formed in the substrate 110a. The fin-shaped active region FAa protrudes upward beyond a top surface of the device isolation film 112 to have a fin shape. Although one fin-shaped active region FAa is illustrated in FIGS. 2A through 2C, a plurality of the fin-shaped active regions FAa that extend in parallel to one another in the one direction (e.g., the Y direction) may be formed. Also, the plurality of fin-shaped active regions FAa may be arranged in the one direction (e.g., the Y direction) to be spaced apart from each other by a predetermined interval.

In some embodiments, a width of an upper portion of the fin-shaped active region FAa in one direction (e.g., an X direction in FIGS. 2A through 2C) may be less than a width of the lower portion of the fin-shaped active region FAa. In some embodiments, an upper end of the fin-shaped active region FAa may have a round shape.

In some embodiments, the device isolation film 112 may have a multi-film structure. For example, the device isolation film 112 may include first and second liners sequentially stacked on an inner wall of the trench TN and a buried insulating film formed on the second liner. The first liner may include, for example, an oxide such as silicon oxide, and the second liner may include, for example, polysilicon or a nitride such as silicon nitride. The buried insulating film may include, for example, an oxide such as silicon oxide.

The fin-shaped active region FAa may have a channel portion CHa, and a base portion BAa that is disposed under the channel portion CHa and has both side walls covered by the device isolation film 112.

The gate insulating film 130 may be formed to cover a top surface and both side walls of the fin-shaped active region FAa. The gate electrode 140 may be formed over the top surface and the both side walls of the fin-shaped active region FAa to cover the gate insulating film 130. The gate electrode 140 may extend in one direction (e.g., the X direction in FIGS. 2A through 2C). The direction (e.g., the X direction) in which the gate electrode 140 extends may be perpendicular to a direction in which the fin-shaped active region FAa extends.

The gate insulating film 130 may include the interface film 132 having a first relative dielectric constant and the high-k dielectric film 134 formed on the interface film 132 and having a second relative dielectric constant higher than the first relative dielectric constant. The interface film 132 of the semiconductor device 200a may be formed between the top surface and the both side walls of the fin-shaped active region FAa and a bottom surface of the gate electrode 140 to face the bottom surface of the gate electrode 140, and the high-k dielectric film 134 may be formed to face the bottom surface and both side walls of the gate electrode 140.

The one pair of source/drain regions 160 may be formed on portions of the fin-shaped active region FAa located on both sides of the gate electrode 140. The source/drain regions 160 may include a semiconductor layer that is epitaxially grown from the fin-shaped active region FAa.

The source/drain regions 160 may be formed of a material having a lattice constant that is higher than that of a material of the fin-shaped active region FAa. The one pair of source/drain regions 160 may be formed of a compound semiconductor material from different groups. For example, the one pair of source/drain regions 160 may be formed of a group III-V compound semiconductor material or a group II-VI compound semiconductor material.

The source/drain regions 160 may include the lower end portion 162, the upper end portion 166, and the stress-reducing layer 164 disposed between the lower end portion 162 and the upper end portion 166.

In some embodiments, the lower end portion 162 and the upper end portion 166 of the source/drain regions 160 may be formed of a group III-V compound semiconductor material that is crystalline or a group II-VI compound semiconductor material that is crystalline, having a lattice constant higher by 7.5% or more (e.g., 7.5% to 20%, but not limited thereto) than that of Si.

The stress-reducing layer 164 may be formed of a group III-V compound semiconductor material that is amorphous or a group II-VI compound semiconductor material that is amorphous. In some embodiments, the stress-reducing layer 164 may be an amorphous layer of the same group III-V compound semiconductor material or group II-VI compound semiconductor material as that of the lower end portion 162 and the upper end portion 166.

In some embodiments, the stress-reducing layer 164 may be formed of a superlattice of a group IV semiconductor material and a group III-V compound semiconductor material or a superlattice of a group IV semiconductor material and a group II-VI compound semiconductor material. In some embodiments, the group IV semiconductor material of the superlattice of the stress-reducing layer 164 may be the same material as that of the fin-shaped active region FAa. In some embodiments, the group III-V compound semiconductor material or the group II-VI compound semiconductor material of the superlattice of the stress-reducing layer 164 may be the same as that of the lower end portion 162 and the upper end portion 166.

When a lattice constant of the source/drain regions 160 is higher than that of the fin-shaped active region FAa, a stress due to a lattice constant difference may be accumulated in the source/drain regions 160 during a process of forming the source/drain regions 160, and thus cracks or crystal defects may occur in the source/drain regions 160. However, in the semiconductor device 200a, since the stress-reducing layer 164 is disposed between the lower end portion 162 and the upper end portion 166 of the source/drain regions 160, cracks or crystal defects may be limited and/or prevented from occurring in the source/drain regions 160, thereby improving the reliability of the semiconductor device 200a.

The buffer layer 120 may be formed between the fin-shaped active region FAa and the source/drain regions 160, particularly, between the fin-shaped active region FAa and the lower end portion 162 of the source/drain regions 160. The buffer layer 120 may reduce a lattice mismatch between the fin-shaped active region FAa and the source/drain regions 160.

The buffer layer 120 may include the lower buffer layer 122 formed on the fin-shaped active region FAa and the upper buffer layer 124 formed on the lower buffer layer 122.

The lower buffer layer 122 may be formed of a group III-V compound semiconductor material that is amorphous or a group II-VI compound semiconductor material that is amorphous. In some embodiments, the lower buffer layer 122 may be an amorphous layer of a material composed of (and/or including) the same atoms as those of the lower end portion 162 and the upper end portion 166 of the source/drain regions 160. In detail, the lower buffer layer 122 may be an amorphous layer of the same group III-V compound semiconductor material or group II-VI compound semiconductor material as that of the lower end portion 162 and the upper end portion 166 of the source/drain regions 160.

The upper buffer layer 124 may be formed of a group III-V compound semiconductor material or a group II-VI compound semiconductor material, and may be a grade layer in which an atomic ratio of a compound semiconductor material changes from bottom to top. In some embodiments, the upper buffer layer 124 may be formed of the same compound semiconductor material as that of the lower end portion 162 and the upper end portion 166 of the source/drain regions 160. The upper buffer layer 124 may be formed so that an overall stoichiometry is constant and a ratio between atoms of the upper buffer layer 124 changes from bottom to top.

For example, from among atoms of a compound semiconductor material of the upper buffer layer 124, for example, first atoms and second atoms from different groups, a ratio of the first atoms whose atomic radii are less than those of the second atoms may decrease from bottom to top of the upper buffer layer 124 and a ratio of the second atoms whose atomic radii are greater than those of the first atoms may increase from bottom to top of the upper buffer layer 124.

The upper buffer layer 124 may reduce a lattice mismatch between the fin-shaped active region FAa and the source/drain regions 160 and may improve the crystallinity of the source/drain regions 160 during a process of forming the source/drain regions 160.

A transistor TRa may be formed at an intersection between the fin-shaped active region FAa and the gate electrode 140. The transistor TRa is a 3D MOS transistor in which channels are formed on the top surface and the both side walls of the fin-shaped active region FAa. The transistor TRa may be a PMOS transistor.

The insulating spacers 144 may be formed on both sides of a gate structure including the gate insulating film 130 and the gate electrode 140 sequentially formed from a surface of the fin-shaped active region FAa. That is, the one pair of insulating spacers 144 may be formed on both side walls of the gate insulating film 130 and the gate electrode 140. As shown in FIG. 2C, the interlayer insulating film 170 that covers the insulating spacers 144 may be formed at a side of the insulating spacers 144 opposite to the gate structure.

The gate insulating film 130 may be formed to cover an inner surface of a space defined between the one pair of insulating spacers 144. The gate electrode 140 may be formed to cover the gate insulating film 130 and to fill the space defined between the one pair of insulating spacers 144.

In the semiconductor device 200a, since the fin-shaped active region FAa, that is, the fin portion 110-2, is formed of a material having an electron mobility that is higher than that of the substrate base 110-1, a mobility of carriers may be increased. Accordingly, an operation speed of the transistor TRa of the semiconductor device 200a may be increased.

In the semiconductor device 200a, since the one pair of source/drain regions 160 are formed of a material having a lattice constant that is higher than that of a material of the fin-shaped active region FAa, the one pair of source/drain regions 160 may apply a compressive stress to the channel portion CHa of the fin-shaped active region FAa, thereby increasing a mobility of carriers, particularly, holes. Accordingly, an operation speed of the transistor TRa of the semiconductor device 200a may be increased.

Also, since the source/drain regions 160 include the stress-reducing layer 164 disposed between the lower end portion 162 and the upper end portion 166, cracks or crystal defects may be limited and/or prevented from occurring in the source/drain regions 160, thereby improving the reliability of the semiconductor device 200a.

Also, since the buffer layer 120 is formed between the fin-shaped active region FAa and the source/drain regions 160, a lattice mismatch between the fin-shaped active region FAa and the source/drain regions 160 may be reduced and the crystallinity of the source/drain regions 160 may be improved during a process of forming the source/drain regions 160.

Figure 3A:
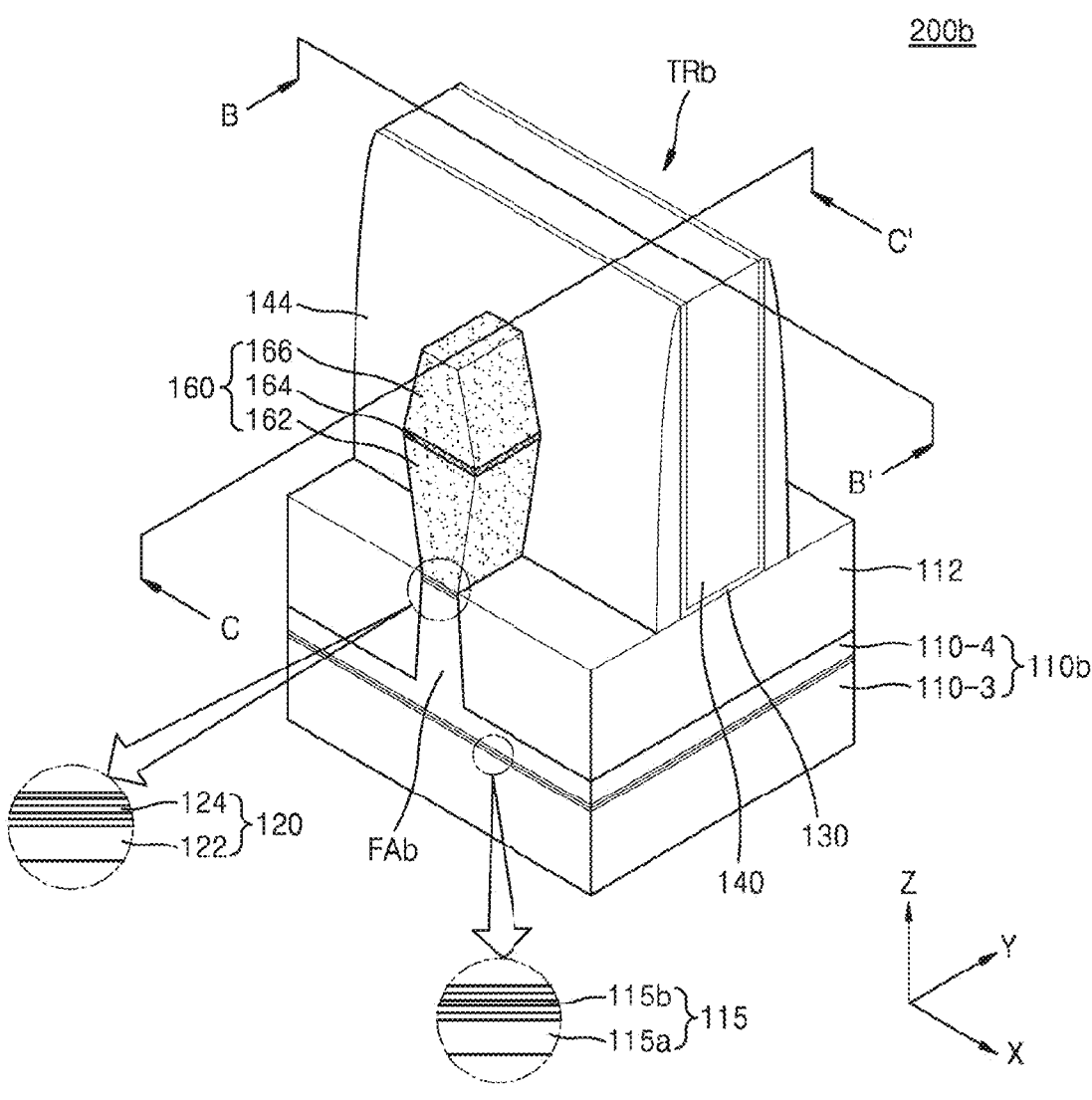
FIGS. 3A through 3C are a perspective view and cross-sectional views illustrating elements of a semiconductor device according to an embodiment.
Figure 3B:
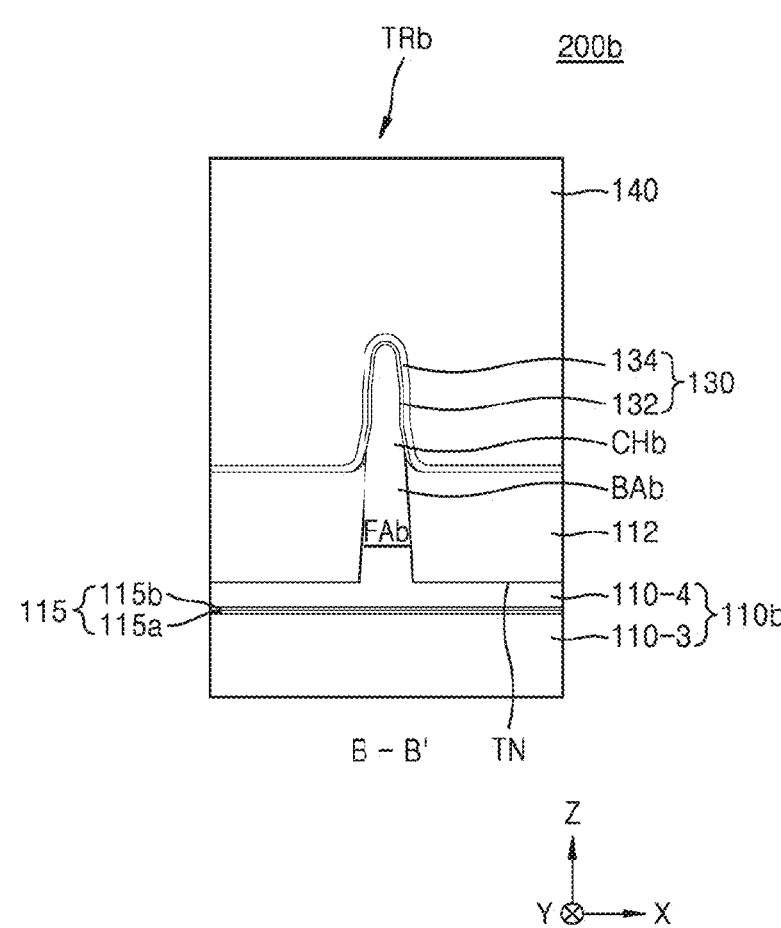
Figure 3C:
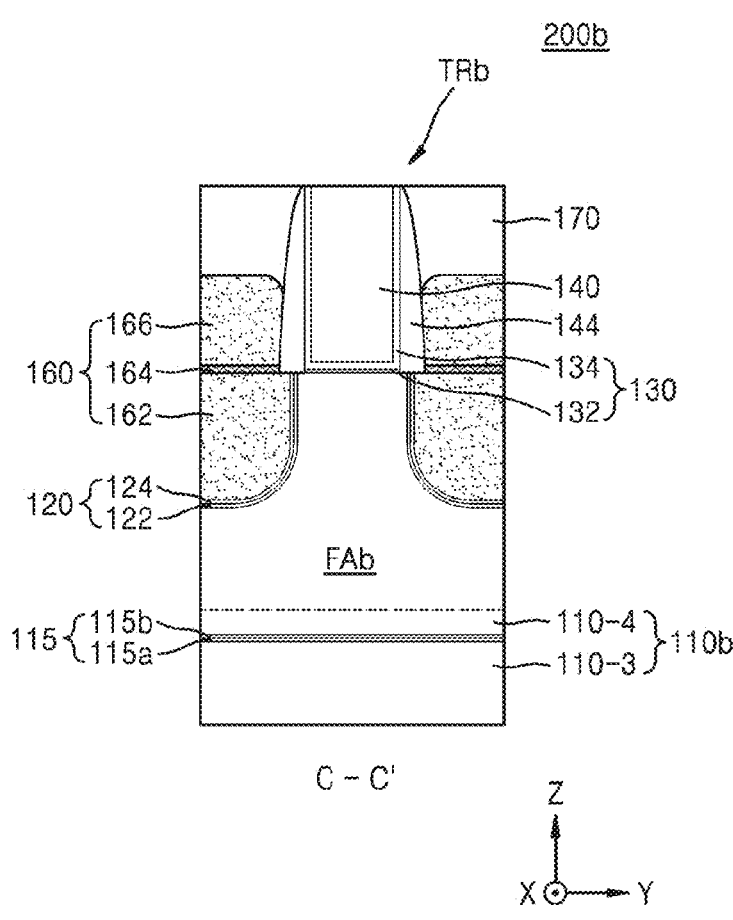

FIGS. 3A through 3C are a perspective view and cross-sectional views illustrating elements of a semiconductor device 200b according to an embodiment. FIG. 3A is a perspective view illustrating elements of the semiconductor device 200b including a transistor having a FinFET structure. FIG. 3B is a cross-sectional view taken along line B-B' of FIG. 3A.

FIG. 3C is a cross-sectional view taken along line C-C' of FIG. 3A. In FIGS. 3A through 3C, the same elements as those in FIGS. 1A through 2C are denoted by the same reference numerals, and thus a detailed explanation thereof will not be given.

Referring to FIGS. 3A through 3C, the semiconductor device 200b includes a fin-shaped active region FAb that protrudes from a substrate 110b in a direction (e.g., a Z direction) perpendicular to a main surface of the substrate 110b. The substrate 110b may include a lower substrate base 110-3 and an upper substrate base 110-4 that is formed on the lower substrate base 110-3. The fin-shaped active region FAb may protrude from the upper substrate base 110-4 in a direction (e.g., the Z direction) perpendicular to a main surface of the upper substrate base 110-4.

The upper substrate base 110-4 may be formed by performing SEG on the lower substrate base 110-3. The upper substrate base 110-4 may include a semiconductor layer that is epitaxially grown from the lower substrate base 110-3.

The lower substrate base 110-3 may be formed of a first semiconductor material and the upper substrate base 110-4 may be formed of a second semiconductor material. The second semiconductor material may have an electron mobility that is higher than that of the first semiconductor material. The lower substrate base 110-3 and the upper substrate base 110-4 may be formed of a group IV semiconductor material. In some embodiments, the first semiconductor material may be Si and the second semiconductor material may be Ge.

The substrate 110b may further include a substrate buffer layer 115 formed between the lower substrate base 110-3 and the upper substrate base 110-4. The substrate buffer layer 115 may reduce a lattice mismatch between the lower substrate base 110-3 and the upper substrate base 110-4.

The substrate buffer layer 115 may include a lower substrate buffer layer 115a formed on the lower substrate base 110-3 and an upper substrate buffer layer 115b formed on the lower substrate buffer layer 115a.

The lower substrate buffer layer 115a may be formed of a group IV semiconductor material that is amorphous. In some embodiments, the lower substrate buffer layer 115a may be an amorphous layer of a material composed of (and/or including) the same atoms as those of the lower substrate base 110-3. In detail, the lower substrate buffer layer 115*a* may be an amorphous layer of the same group IV semiconductor material as that of the lower substrate base 110-3. For example, the lower substrate buffer layer 115*a* may be an amorphous layer of a group IV semiconductor material such as Si.

The upper substrate buffer layer 115*b* may be formed of a compound semiconductor material composed of (and/or including) atoms of the lower substrate base 110-3 and atoms of the upper substrate base 110-4. The upper substrate buffer layer 115*b* may be formed of a group IV compound semiconductor material, and may be a grade layer in which an atomic ratio of a compound semiconductor material changes from bottom to top. The upper substrate buffer layer 115*b* may be formed so that an overall stoichiometry is constant and a ratio between atoms of the upper substrate buffer layer 115*b* changes from bottom to top. For example, from among atoms of a compound semiconductor material of the upper substrate buffer layer 115*b*, for example, first atoms and second atoms from different groups, a ratio of the first atoms whose atomic radii are less than those of the second atoms may decrease from bottom to top of the upper substrate buffer layer 115*b* and a ratio of the second atoms whose atomic radii are greater than those of the first atoms may increase from bottom to top of the upper substrate buffer layer 115*b*. In some embodiments, the first atoms may be Si atoms and the second atoms may be Ge atoms. For example, the upper substrate buffer layer 115*b* may include a multi-layer film in which a ratio between the first atoms and the second atoms is, but not limited, 90%: 10%, 80%: 20%, 70%: 30%, 50%: 50%, 30%: 70%, 20%: 80% or 10%: 90%. In other words, the ratio of first atoms to second atoms may be in a range from 90%: 10% to 10%: 90%. In some embodiments, the upper substrate buffer layer 115*b* may be formed so that a ratio between the first atoms and the second atoms changes continuously.

In some embodiments, the lower substrate base 110-3 may have a SOI structure. For example, the lower substrate base 110-3 may include a BOX layer. The lower substrate base 110-3 and/or the upper substrate base 110-4 may include a conductive region, for example, a well doped with impurities. The lower substrate base 110-3 and/or the upper substrate base 110-4 may have any of various device isolation structures such as a STI structure or a DTI structure.

The fin-shaped active region FAb may extend in one direction (e.g., a Y direction in FIGS. 3A through 3C). The device isolation film 112 that covers side walls of a lower portion of the fin-shaped active region FAb is formed on the upper substrate base 110-4. The device isolation film 112 may fill a lower portion of the trench TN formed in the upper substrate base 110-4. The fin-shaped active region FAb protrudes upward beyond a top surface of the device isolation film 112 to have a fin shape. Although one fin-shaped active region FAb is illustrated in FIGS. 3A through 3C, a plurality of the fin-shaped active regions FAb that extend in parallel to one another in the one direction (e.g., the Y direction) may be formed. Also, the plurality of fin-shaped active regions FAb may be arranged in the one direction (e.g., the Y direction) to be spaced apart from each other by a predetermined interval.

In some embodiments, a width of an upper portion of the fin-shaped active region FAb in one direction (e.g., an X direction in FIGS. 3A through 3C) may be less than a width of the lower portion of the fin-shaped active region FAb. In some embodiments, an upper end of the fin-shaped active region FAb may have a round shape.

In some embodiments, the device isolation film 112 may have a multi-film structure. For example, the device isolation film 112 may include first and second liners sequentially stacked on an inner wall of the trench TN and a buried insulating film formed on the second liner. The first liner may include, for example, an oxide such as silicon oxide, and the second liner may include, for example, polysilicon or a nitride such as silicon nitride. The buried insulating film may include, for example, an oxide such as silicon oxide.

The fin-shaped active region FAb may have a channel portion CHb, and a base portion BAb that is disposed under the channel portion CHb and has both side walls covered by the device isolation film 112.

The gate insulating film 130 may be formed to cover a top surface and both side walls of the fin-shaped active region FAb. The gate electrode 140 may be formed over the top surface and the both side walls of the fin-shaped active region FAb to cover the gate insulating film 130. The gate electrode 140 may extend in one direction (e.g., the X direction in FIGS. 3A through 3C). The direction (e.g., the X direction) in which the gate electrode 140 extends may be perpendicular to a direction in which the fin-shaped active region FAb extends.

The gate insulating film 130 may include the interface film 132 having a first relative dielectric constant and the high-k dielectric film 134 formed on the interface film 132 and having a second relative dielectric constant higher than the first relative dielectric constant. The interface film 132 of the semiconductor device 200*b* may be formed between the top surface and the both side walls of the fin-shaped active region FAb and a bottom surface of the gate electrode 140 to face the bottom surface of the gate electrode 140, and the high-k dielectric film 134 may be formed to face the bottom surface and both side walls of the gate electrode 140.

The one pair of source/drain regions 160 may be formed on portions of the fin-shaped active region FAb located on both sides of the gate electrode 140. The source/drain regions 160 may include a semiconductor layer that is epitaxially grown from the fin-shaped active region FAb.

The source/drain regions 160 may be formed of a material having a lattice constant that is higher than that of a material of the fin-shaped active region FAb. The one pair of source/drain regions 160 may be formed of a compound semiconductor material from different groups. For example, the one pair of source/drain regions 160 may be formed of a group III-V compound semiconductor material or a group II-VI compound semiconductor material.

The source/drain regions 160 may include the lower end portion 162, the upper end portion 166, and the stress-reducing layer 164 disposed between the lower end portion 162 and the upper end portion 166.

In some embodiments, the lower end portion 162 and the upper end portion 166 of the source/drain regions 160 may be formed of a group III-V compound semiconductor material that is crystalline or a group II-VI compound semiconductor material that is crystalline, having a lattice constant higher by 7.5% or more (e.g., 7.5% to 20%, but not limited thereto) than that of Si.

The stress-reducing layer 164 may be formed of a group III-V compound semiconductor material that is amorphous or a group II-VI compound semiconductor material that is amorphous. In some embodiments, the stress-reducing layer 164 may be an amorphous layer of the same group III-V compound semiconductor material or group II-VI compound semiconductor material as that of the lower end portion 162 and the upper end portion 166.

In some embodiments, the stress-reducing layer 164 may be formed of a superlattice of a group IV semiconductor material and a group III-V compound semiconductor material or a superlattice of a group IV semiconductor material and a group II-VI compound semiconductor material. In some embodiments, the group IV semiconductor material of the superlattice of the stress-reducing layer 164 may be the same material as that of the fin-shaped active region FAb. In some embodiments, the group III-V compound semiconductor material or the group II-VI compound semiconductor material of the superlattice of the stress-reducing layer 164 may be the same as that of the lower end portion 162 and the upper end portion 166.

When a lattice constant of the source/drain regions 160 is higher than that of the fin-shaped active region FAb, a stress due to a lattice constant difference may be accumulated in the source/drain regions 160 during a process of forming the source/drain regions 160, and thus cracks or crystal defects may occur in the source/drain regions 160. However, in the semiconductor device 200*b* according to the present embodiment, since the stress-reducing layer 164 is disposed between the lower end portion 162 and the upper end portion 166 of the source/drain regions 160, cracks or crystal defects may be limited and/or prevented from occurring in the source/drain regions 160, thereby improving the reliability of the semiconductor device 200*b*.

The buffer layer 120 may be formed between the fin-shaped active region FAb and the source/drain regions 160, particularly, between the fin-shaped active region FAb and the lower end portion 162 of the source/drain regions 160. The buffer layer 120 may reduce a lattice mismatch between the fin-shaped active region FAb and the source/drain regions 160.

The buffer layer 120 may include the lower buffer layer 122 formed on the fin-shaped active region FAb and the upper buffer layer 124 formed on the lower buffer layer 122.

The lower buffer layer 122 may be formed of a group III-V compound semiconductor material that is amorphous or a group II-VI compound semiconductor material that is amorphous. In some embodiments, the lower buffer layer 122 may be an amorphous layer of a material composed of (and/or including) the same atoms as those of the lower end portion 162 and the upper end portion 166 of the source/drain regions 160. In detail, the lower buffer layer 122 may be an amorphous layer of the same group III-V compound semiconductor material or group II-VI compound semiconductor material as that of the lower end portion 162 and the upper end portion 166 of the source/drain regions 160.

The upper buffer layer 124 may be formed of a group III-V compound semiconductor material or a group II-VI compound semiconductor material, and may be a grade layer in which an atomic ratio of a compound semiconductor material changes from bottom to top. In some embodiments, the upper buffer layer 124 may be formed of the same compound semiconductor material as that of the lower end portion 162 and the upper end portion 166 of the source/drain regions 160. The upper buffer layer 124 may be formed so that an overall stoichiometry is constant and a ratio between atoms of the upper buffer layer 124 changes from bottom to top. For example, from among atoms of a compound semiconductor material of the upper buffer layer 124, for example, first atoms and second atoms from different groups, a ratio of the first atoms whose atomic radii are less than those of the second atoms may decrease from bottom to top of the upper buffer layer 124 and a ratio of the second atoms whose atomic radii are greater than those of the first atoms may increase from bottom to top of the upper buffer layer 124.

The upper buffer layer 124 may reduce a lattice mismatch between the fin-shaped active region FAb and the source/drain regions 160 and may improve the crystallinity of the source/drain regions 160 during a process of forming the source/drain regions 160.

A transistor TRb may be formed at an intersection between the fin-shaped active region FAb and the gate electrode 140. The transistor TRb is a 3D MOS transistor in which channels are formed on the top surface and the both side walls of the fin-shaped active region FAb. The transistor TRb may be a PMOS transistor.

The insulating spacers 144 may be formed on both sides of a gate structure including the gate insulating film 130 and the gate electrode 140 sequentially formed from a surface of the fin-shaped active region FAb. That is, the one pair of insulating spacers 144 may be formed on both side walls of the gate insulating film 130 and the gate electrode 140. As shown in FIG. 3C, the interlayer insulating film 170 that covers the insulating spacers 144 may be formed at a side of the insulating spacers 144 opposite to the gate structure.

The gate insulating film 130 may be formed to cover an inner surface of a space defined between the one pair of insulating spacers 144. The gate electrode 140 may be formed to cover the gate insulating film 130 and to fill the space defined between the one pair of insulating spacers 144.

In the semiconductor device 200*b*, since the upper substrate base 110-4, that is, the fin-shaped active region FAb, is formed of a material having an electron mobility that is higher than that of the lower substrate base 110-3, a mobility of carriers may be increased. Accordingly, an operation speed of the transistor TRb of the semiconductor device 200*b* may be increased.

In the semiconductor device 200*b*, since the one pair of source/drain regions 160 are formed of a material having a lattice constant that is higher than that of a material of the fin-shaped active region FAb, the one pair of source/drain regions 160 may apply a compressive stress to the channel portion CHb of the fin-shaped active region FAb, thereby increasing a mobility of carriers, particularly, holes. Accordingly, an operation speed of the transistor TRb of the semiconductor device 200*b* may be increased.

Also, since the source/drain regions 160 include the stress-reducing layer 164 disposed between the lower end portion 162 and the upper end portion 166, cracks or crystal defects may be limited and/or prevented from occurring in the source/drain regions 160, thereby improving the reliability of the semiconductor device 200*b*.

Also, since the buffer layer 120 is formed between the fin-shaped active region FAb and the source/drain regions 160, a lattice mismatch between the fin-shaped active region FAb and the source/drain regions 160 may be reduced and the crystallinity of the source/drain regions 160 may be improved during a process of forming the source/drain regions 160.

Figure 4A:
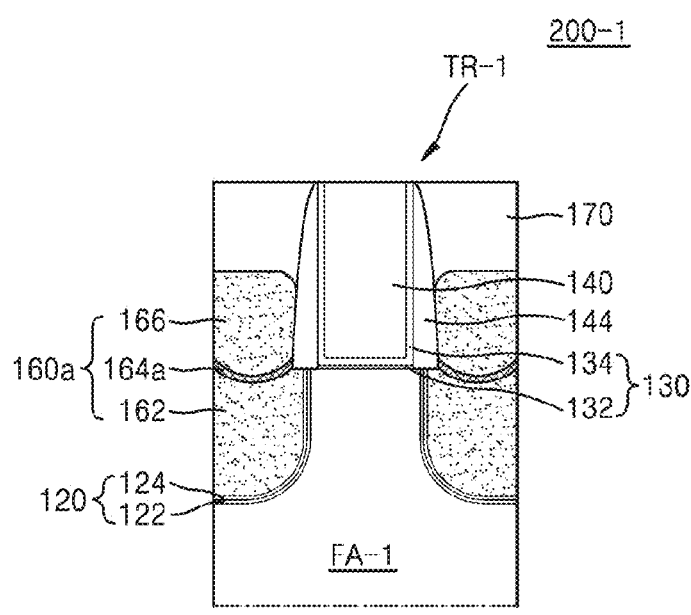
FIGS. 4A and 4B are cross-sectional views illustrating elements of a semiconductor device according to an embodiment.
Figure 4A:
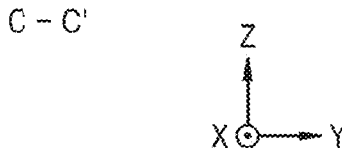
Figure 4B:
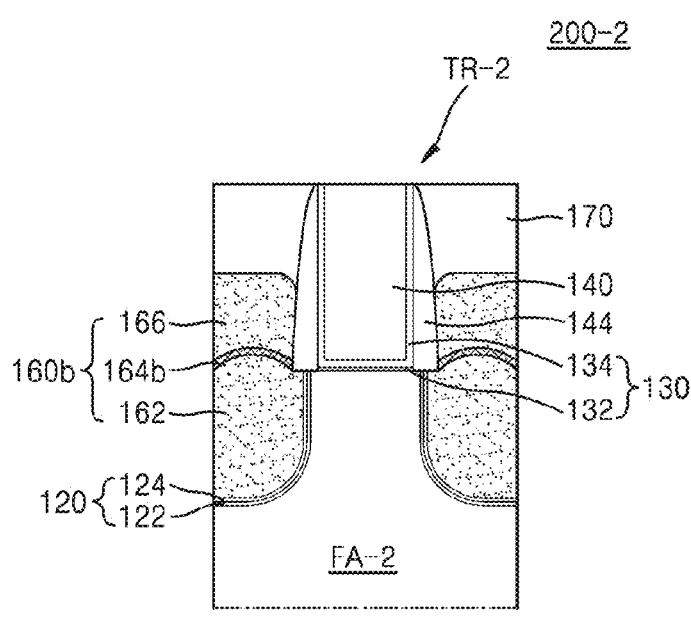
Figure 4B:

FIGS. 4A and 4B are cross-sectional views illustrating elements of a semiconductor device 200-1 according to an embodiment. In FIGS. 4A and 4B, the same elements as those in FIGS. 1A through 3C are denoted by the same reference numerals, and thus a detailed explanation thereof will not be given.

Referring to FIG. 4*a*, the semiconductor device 200-1 includes a fin-shaped active region FA-1, the gate insulating film 130 formed to cover a top surface and both side walls of the fin-shaped active region FA-1, and the gate electrode 140 formed over the top surface and the both side walls of the fin-shaped active region FA-1 to cover the gate insulating film 130. The insulating spacers 144 may be formed on both sides of a gate structure including the gate insulating film 130 and the gate electrode 140 sequentially formed from a surface of the fin-shaped active region FA-1. A transistor TR-1 may be formed at an intersection between the fin-shaped active region FA-1 and the gate electrode 140.

One pair of source/drain regions 160a may be formed on portions of the fin-shaped active region FA-1 located on both sides of the gate electrode 140. The one pair of source/drain regions 160a may include a semiconductor layer that is epitaxially grown from the fin-shaped active region FA-1. The source/drain regions 160a may include the lower end portion 162, the upper end portion 166, and a stress-reducing layer 164a disposed between the lower end portion 162 and the upper end portion 166.

The stress-reducing layer 164a of the source/drain regions 160a of FIG. 4A may have a concave shape that curves downward.

Referring to FIG. 4B, a semiconductor device 200-2 includes a fin-shaped active region FA-2, the gate insulating film 130 formed to cover a top surface and both side walls of the fin-shaped active region FA-2, and the gate electrode 140 formed over the top surface and the both side walls of the fin-shaped active region FA-2 to cover the gate insulating film 130. The insulating spacers 144 may be formed on both sides of a gate structure including the gate insulating film 130 and the gate electrode 140 sequentially formed from a surface of the fin-shaped active region FA-2. A transistor TR-2 may be formed at an intersection between the fin-shaped active region FA-2 and the gate electrode 140.

One pair of source/drain regions 160b may be formed on portions of the fin-shaped active region FA-2 located on both sides of the gate electrode 140. The one pair of source/drain regions 160b may include a semiconductor layer that is epitaxially grown from the fin-shaped active region FA-2. The source/drain regions 160b may include the lower end portion 162, the upper end portion 166, and a stress-reducing layer 164b disposed between the lower end portion 162 and the upper end portion 166.

The stress-reducing layer 164b of the source/drain regions 160b of FIG. 4B may have a convex shape that bulges upward.

Referring to FIGS. 1A through 4B, since the source/drain regions 160 or 160a are epitaxially grown from the fin-shaped active region FA, FAa, FAb, FA-1, or FA-2, the source/drain regions 160 or 160a may be grown in both a vertical direction (e.g., the Z direction) and horizontal directions (e.g., the X and Y directions). When a speed at which the source/drain regions 160, 160a, or 160b are grown in the vertical direction (e.g., the Z direction) is greater than a speed at which the source/drain regions 160, 160a, or 160b are grown in the horizontal directions (e.g., the X and Y directions), the source/drain regions 160, 160a, or 160b may be grown to have a concave top surface, a flat top surface, and then a convex top surface. Accordingly, according to a time when the stress-reducing layer 164, 164a, or 164b is formed after the lower end portion 162 is formed, the stress-reducing layer 164, 164a, or 164b may have a flat surface, like the stress-reducing layer 164 of FIGS. 1A through 3B, may have a concave surface that curves downward, like the stress-reducing layer 164a of FIG. 4A, and may have a convex surface that bulges upward, like the stress-reducing layer 164b of FIG. 4B.

A time when the stress-reducing layer 164, 164a, or 164b is formed may be determined in consideration of a stress accumulated in the source/drain regions 160, 160a, or 160b.

FIGS. 5 through 17 are cross-sectional views for explaining a method of manufacturing a semiconductor device according to an embodiment. FIGS. 5 through 17 are cross-sectional views for explaining a method of manufacturing a semiconductor device including a transistor having a Fin-FET structure. A method of manufacturing the semiconductor device 200 of FIGS. 1A through 1C will now be explained with reference to FIGS. 5 through 17. In detail, FIGS. 5, 6, 7, 8A, 9A, 10A, 11A, and 16A are cross-sectional views taken along line B-B' of FIG. 1A. FIGS. 8B, 9B, 10B, 11B, 12, 13, 14, 15, 16B, and 17 are cross-sectional views taken along line C-C' of FIG. 1A. In FIGS. 5 through 17, the same elements as those in FIGS. 1A through 1C are denoted by the same reference numerals, and a detailed explanation thereof will not be given.

Figure 5:
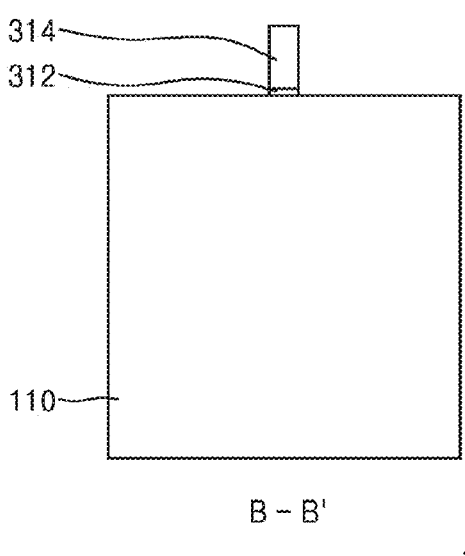
FIGS. 5 through 17 are cross-sectional views for explaining a method of manufacturing a semiconductor device according to an embodiment.

Referring to FIG. 5, the substrate 110 is prepared, and then a pad oxide film pattern 312 and a first mask pattern 314 are formed on the substrate 110.

The pad oxide film pattern 312 and the first mask pattern 314 may extend in one direction (e.g., the Y direction) on the substrate 110.

In some embodiments, the pad oxide film pattern 312 may include an oxide film obtained by thermally oxidizing a surface of the substrate 110. The first mask pattern 314 may include, but not limited to, a silicon nitride film, a silicon oxynitride film, a spin-on-glass (SOG) film, a spin-on hard-mask (SOH) film, a photoresist film, or a combination thereof.

Figure 6:
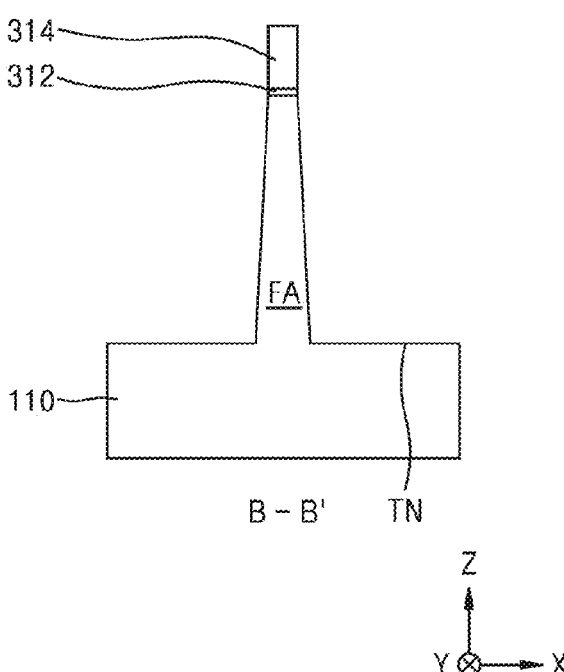

Referring to FIG. 6, the trench TN is formed in the substrate 110 by etching a portion of the substrate 110 by using the first mask pattern 314 as an etching mask. As the trench TN is formed, the fin-shaped active region FA that protrudes from the substrate 110 upward in the direction (e.g., the Z direction) perpendicular to the main surface of the substrate 110 and extends in one direction (e.g., the Y direction) may be obtained.

Figure 7:
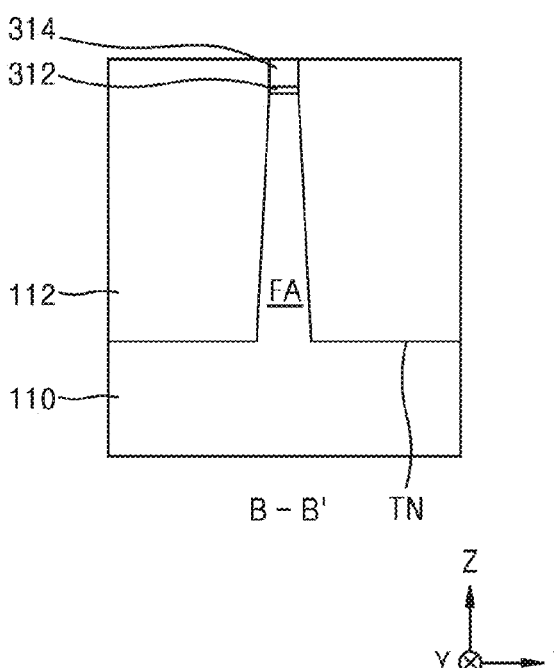

Referring to FIG. 7, the device isolation film 112 that fills the trench TN to cover an exposed surface of a pre-fin-shaped active region PA is formed.

The device isolation film 112 may be formed by using, but not limited to, PECVD, HDP CVD, ICP CVD, CCP CVD, FCVD, and/or spin coating.

After the device isolation film 112 is formed, a top surface may be planarized to expose the first mask pattern 314. In this case, a part of the first mask pattern 314 may be removed, and thus a height of the first mask pattern 314 may be reduced.

Figure 8A:
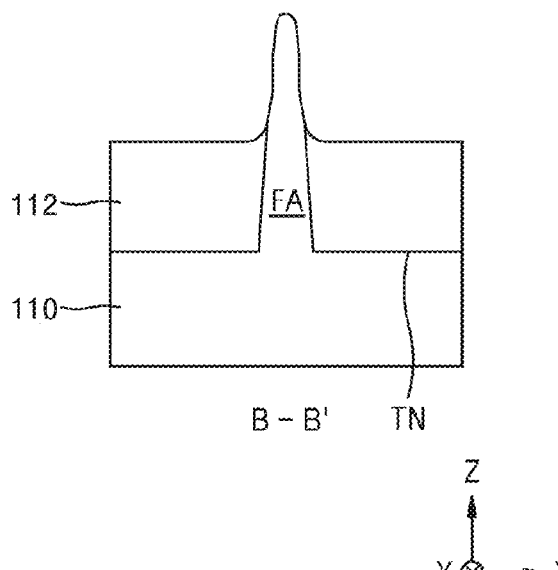
Figure 8B:
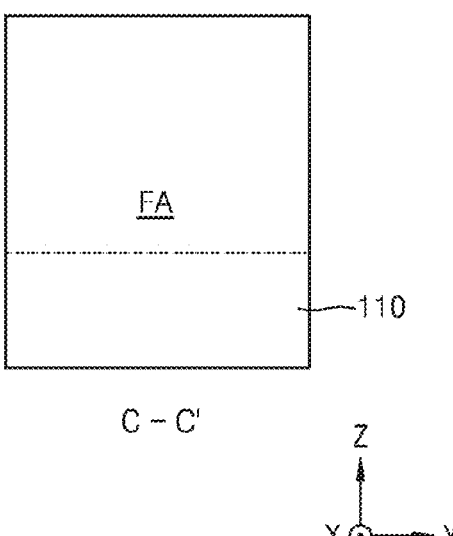

Referring to FIGS. 8A and 8B, the mask pattern 314 (see FIG. 7) and the pad oxide film pattern 312 (see FIG. 7) are removed to expose a top surface and upper side walls of the pre-fin-shaped active region PA (see FIG. 7), and a recess process for removing a part of the device isolation film 112 is performed. As a result, a height of the top surface of the device isolation film 112 may be reduced, and the fin-shaped active region FA may be obtained.

In order to perform the recess process, a dry etching process, a wet etching process, or a combination process thereof may be used.

When the first mask pattern 314 includes a silicon nitride film, a wet etching process using, for example, $H_3PO_4$, may be performed to remove the first mask pattern 314. A wet etching process using, for example, dilute hydrofluoric acid (DHF), may be performed to remove the pad oxide film pattern 312. In order to perform the recess process on the device isolation film 112, a wet etching process using NH₄OH, tetramethyl ammonium hydroxide (TMAH), or potassium hydroxide (KOH) as an etchant or a dry etching process such as inductively coupled plasma (ICP), transformer coupled plasma (TCP), electron cyclotron resonance (ECR), or reactive ion etching (RIE) may be used. When the recess process is performed on the device isolation film 112 by using dry etching, a fluorine-containing gas such as $CF_4$, a chlorine-containing gas such as $Cl_2$, or HBr may be used. However, the present embodiment is not limited thereto.

While the recess process is performed, an exposed upper portion of the fin-shaped active region FA may be exposed to an etching atmosphere such as plasma, and an exposed surface of the fin-shaped active region FA may be damaged due to the etching atmosphere or a roughness of the exposed surface of the fin-shaped active region FA may be degraded. Accordingly, in some embodiments, in order to improve the roughness of the exposed surface of the fin-shaped active region FA, a wet etching process may be performed or a process of forming and removing a sacrificial oxide film may be performed. In a process of removing a part of the device isolation film 112 or improving the roughness of the exposed surface of the fin-shaped active region FA, a width of the channel portion CH (see FIG. 1B) of the fin-shaped active region FA that is exposed on the top surface of the device isolation film 112 in one direction (e.g., the X direction) may be less than that of the fin-shaped active region FA of FIG. 6. Also, an upper end of the fin-shaped active region FA may have a round shape.

In some embodiments, impurity ion implantation for adjusting a threshold voltage may be performed on an upper portion of the fin-shaped active region FA. During the impurity ion implantation for adjusting the threshold voltage, boron (B) ions may be implanted as impurities to form an NMOS transistor and phosphorus (P) or arsenic (As) may be implanted as impurities to form a PMOS transistor. The impurity ion implantation for adjusting the threshold voltage may be performed before or after the process of improving the roughness of the exposed surface of the fin-shaped active region FA is performed.

Figure 9A:
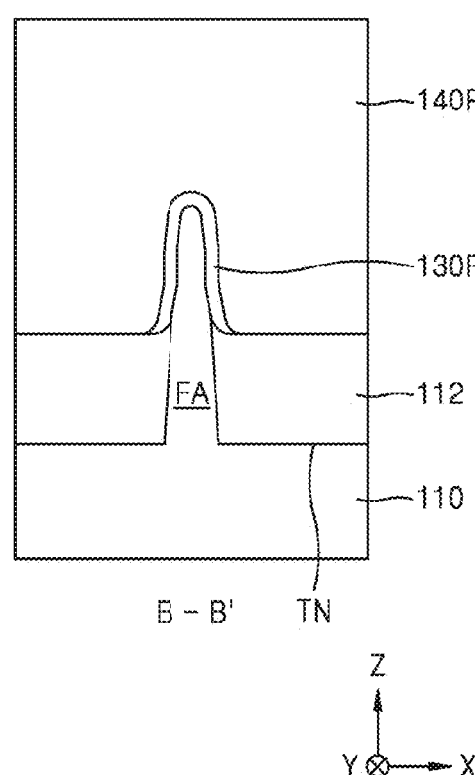
Figure 9B:
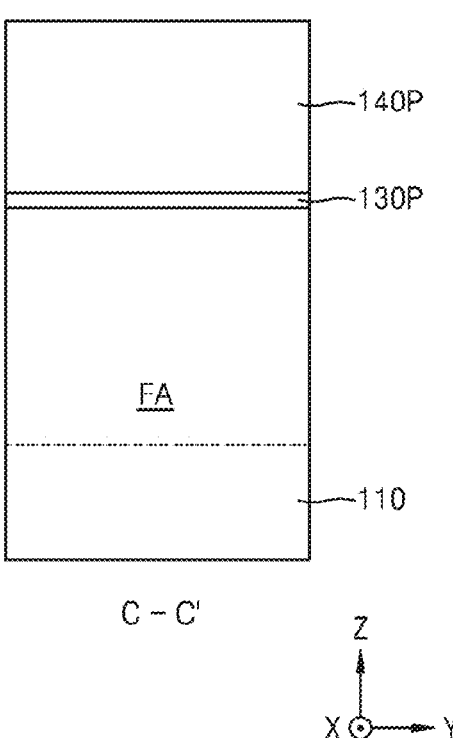

Referring to FIGS. 9A and 9B, a pre-dummy gate insulating film 130P and a pre-dummy gate electrode film 140P are formed on the substrate 110 including the fin-shaped active region FA. The pre-dummy gate insulating film 130P may include, for example, but not limited to, a silicon oxide film, and the pre-dummy gate electrode film 140P may include, for example, but not limited to, polysilicon.

The pre-dummy gate insulating film 130P may be formed by using CVD or ALD. Alternatively, the pre-dummy gate insulating film 130P may be formed by performing thermal oxidation on an upper portion of the substrate 110. In this case, the pre-dummy gate insulating film 130P may be formed only on the top surface of the fin-type active region FA. The pre-dummy gate electrode film 140P may be formed by using CVD or ALD.

Figure 10A:
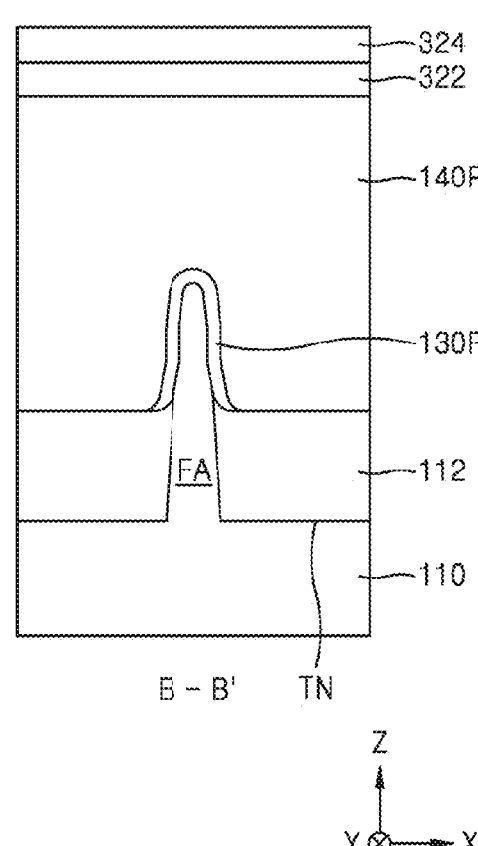
Figure 10B:
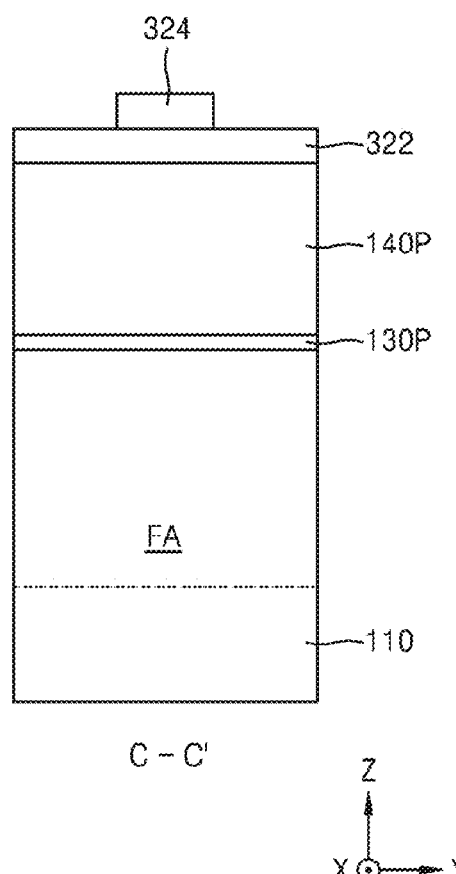

Referring to FIGS. 10A and 10B, a gate mask layer 322 that covers the pre-dummy gate electrode film 140P and a second mask pattern 324 that extends in one direction (e.g., the X direction) to cover a part of the gate mask layer 322 are formed. The gate mask layer 322 may include a nitride such as silicon nitride. The second mask pattern 324 may include, for example, but not limited to, a silicon oxynitride film, an SOG film, an SOH film, a photoresist film, or a combination thereof.

Figure 11A:
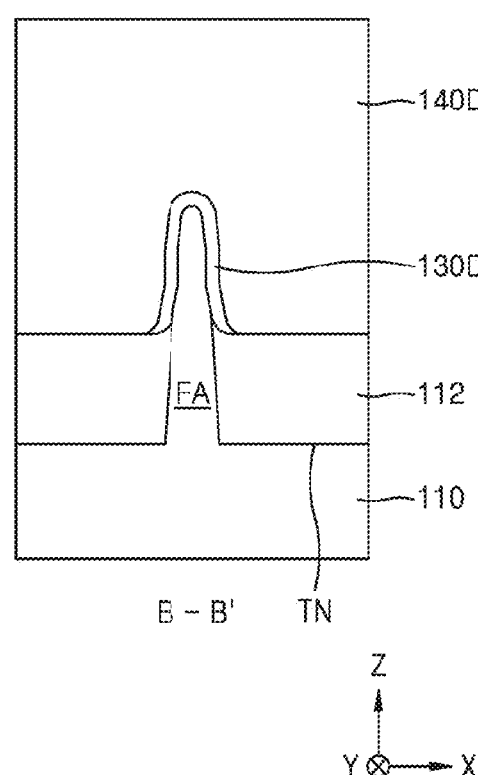
Figure 11B:
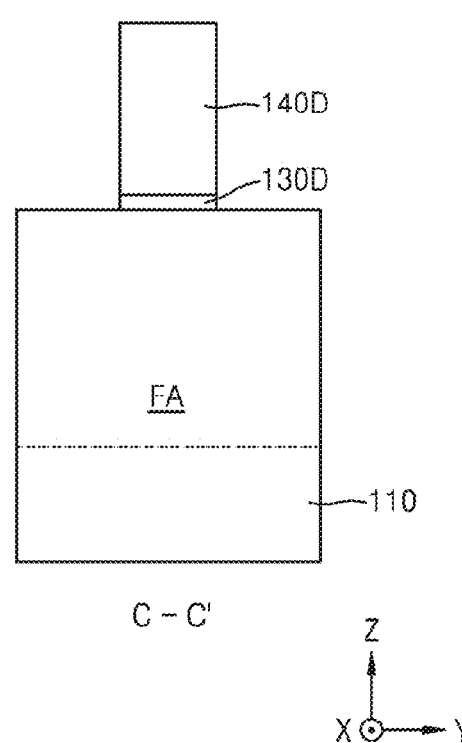

Referring to FIGS. 11A and 11B, the gate mask layer 322 (see FIGS. 10A and 10B) is etched by using the second mask pattern 324 (see FIGS. 10A and 10B) as an etching mask, and then the pre-dummy gate electrode film 140P (see FIGS. 10A and 10B) and the pre-dummy gate insulating film 130P (see FIGS. 10A and 10B) are etched by using the etched gate mask layer 322 as an etching mask, to form a dummy gate electrode 140D and a dummy gate insulating film 130D.

In a process of etching the gate mask layer 322 and/or a process of forming the dummy gate electrode 140D and the dummy gate insulating film 130D, the second mask pattern 324 may be completely removed or may partially remain. Even when a part of the second mask pattern 324 remains, the remaining part of the second mask pattern 324 may be removed by using a subsequent ashing process and/or stripping process.

In the process of forming the dummy gate electrode 140D and the dummy gate insulating film 130D, a part of the gate mask layer 322 may be removed and another part of the gate mask layer 322 may remain on the dummy gate electrode 140D.

Figure 12:
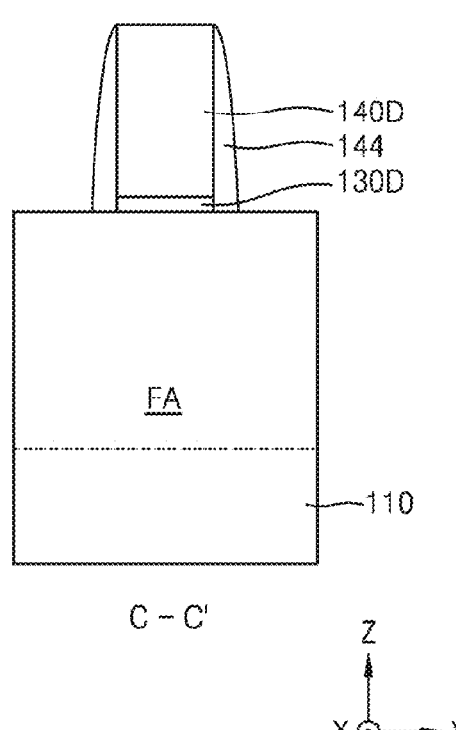

Referring to FIG. 12, the one pair of insulating spacers 144 that cover both side walls of the dummy gate insulating film 130D and the dummy gate electrode 140D are formed. The insulating spacers 144 may include, but not limited to, a silicon nitride film, a silicon oxynitride film, a carbon-containing silicon oxynitride film, or a combination film thereof or may include, but not limited to, an air gap or a low-k dielectric film therein.

The insulating spacers 144 may be formed by forming a pre-spacer layer that conformably covers the substrate 110 over which the dummy gate electrode 140D is formed and performing an etch-back process.

Figure 13:
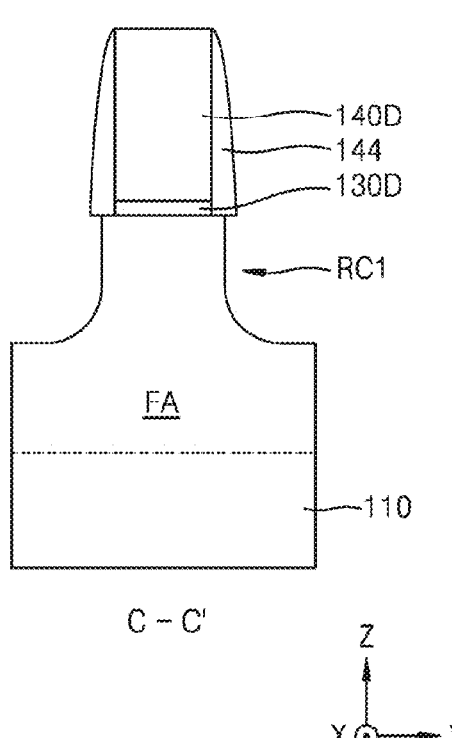

Referring to FIG. 13, a first recess space RC1 is formed by removing an upper part of the fin-shaped active region FA adjacent to the dummy gate electrode 140D on which tine insulating spacers 144 are formed.

In detail, the first recess space RC1 is formed by removing an upper part of the fin-shaped active region FA by using the insulating spacers 144 and the dummy gate electrode 140D as etching masks.

In some embodiments, an etching process of forming the first recess space RC1 and an etch-back process of forming the insulating spacers 144 may be performed in situ.

Figure 14:
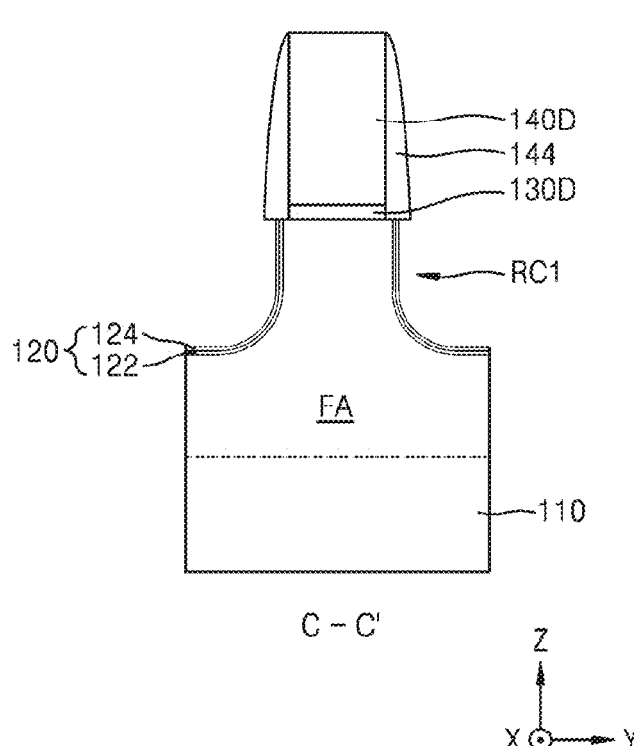

Referring to FIG. 14, the buffer layer 120 including the lower buffer layer 122 and the upper buffer layer 124 is formed by sequentially forming the lower buffer layer 122 and the upper buffer layer 124 on a surface of the fin-shaped active region FA that is exposed through the first recess space RC1.

The lower buffer layer 122 may be formed of a group III-V compound semiconductor material that is amorphous or a group II-VI compound semiconductor material that is amorphous. In some embodiments, the lower buffer layer 122 may be an amorphous layer of a material composed of (and/or including) the same atoms as those of the lower end portion 162 (see FIG. 15) and the upper end portion 166 (see FIG. 15) of the source/drain regions 160 (see FIG. 15). In detail, the lower buffer layer 122 may be an amorphous layer of the same group III-V compound semiconductor material or group II-VI compound semiconductor material as that of the lower end portion 162 and the upper end portion 166 of the source/drain regions 160. For example, the lower buffer layer 122 may include an amorphous layer of a group III-V compound semiconductor material such as GaSb, AlSb, or InP or an amorphous layer of a group II-VI compound semiconductor material such as CdSe, MgSe, ZnTe, MgTe, or GdTe.

The upper buffer layer 124 may be formed of a group III-V compound semiconductor material or a group II-VI compound semiconductor material, and may be a grade layer in which an atomic ratio of a compound semiconductor material changes from bottom to top. In some embodiments, the upper buffer layer 124 may be formed of the same compound semiconductor material as that of the lower end portion 162 and the upper end portion 166 of the source/drain regions 160. The upper buffer layer 124 may be formed so that an overall stoichiometry is constant and a ratio between atoms of the upper buffer layer 124 changes from bottom to top. For example, from among atoms of a compound semiconductor material of the upper buffer layer 124, for example, first atoms and second atoms from different groups, a ratio of the first atoms whose atomic radii are less than those of the second atoms may decrease from bottom to top of the upper buffer layer 124 and a ratio of the second atoms whose atomic radii are greater than those of the first atoms may increase from bottom to top of the upper buffer layer 124. For example, the upper buffer layer 124 may include a multi-layer film in which a ratio between the first atoms and the second atoms is, but not limited, 90%: 10%, 80%: 20%, 70%: 30%, 50%: 50%, 30%: 70%, 20%: 80% or 10%: 90% (e.g., in a range from 90%: 10% to 10%: 90%). In some embodiments, the upper buffer layer 124 may be formed so that a ratio between the first atoms and the second atoms changes continuously. That is, the upper buffer layer 124 may be formed by adjusting a ratio between supplied precursors of the first atoms and supplied precursors of the second atoms.

Figure 15:
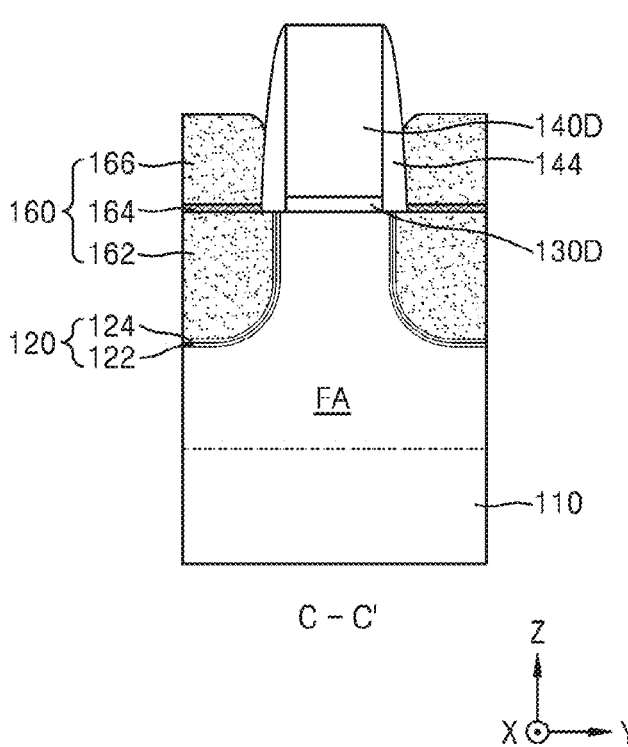

Referring to FIG. 15, the one pair of source/drain regions 160 that fill the first recess space RC1 are formed on the buffer layer 120. The source/drain regions 160 may be formed by performing SEG using a surface of the buffer layer 120, particularly, the upper buffer layer 124, as a seed. The one pair of source/drain regions 160 may include a semiconductor layer that is epitaxially grown from the fin-shaped active region FA. The source/drain regions 160 may be formed to protrude from both sides of the gate electrode 140 that is higher than the first recess space RC1.

The one pair of source/drain regions 160 may be formed of a material having a lattice constant that is higher than that of a material of the fin-shaped active region FA. The one pair of source/drain regions 160 may be formed of a compound semiconductor material from different groups. For example, the one pair of source/drain regions 160 may be formed of a group III-V compound semiconductor material or a group II-VI compound semiconductor material.

Since the buffer layer 120 is formed between the fin-shaped active region FA and the source/drain regions 160, a lattice mismatch between the fin-shaped active region FA and the source/drain regions 160 may be reduced.

The source/drain regions 160 may include the lower end portion 162, the upper end portion 166, and the stress-reducing layer 164 disposed between the lower end portion 162 and the upper end portion 166.

In some embodiments, the lower end portion 162 and the upper end portion 166 of the source/drain regions 160 may be formed of a group III-V compound semiconductor material that is crystalline or a group II-VI compound semiconductor material that is crystalline, having a lattice constant higher by 7.5% or more than that of Si. For example, the lower end portion 162 and the upper end portion 166 may be formed of a group III-V compound semiconductor material such as GaSb, AlSb, or InP or a group II-VI compound semiconductor material such as CdSe, MgSe, ZnTe, MgTe, or GdTe. GaSb, AlSb, InP, CdSe, MgSe, ZnTe, MgTe, and CdTe may respectively have lattice constants of 6.096 Å, 6.136 Å, 5.869 Å 6.05 Å, 5.873 Å, 6.101 Å, 6.417 Å, and 6.48 Å.

The stress-reducing layer 164 may be formed of a group III-V compound semiconductor material that is amorphous or a group II-VI compound semiconductor material that is amorphous. In some embodiments, the stress-reducing layer 164 may be an amorphous layer of the same group III-V compound semiconductor material or group II-VI compound semiconductor material as that of the lower end portion 162 and the upper end portion 166. For example, the stress-reducing layer 164 may include an amorphous layer of a group III-V compound semiconductor material such as GaSb, AlSb, or InP or an amorphous layer of a group II-VI compound semiconductor material such as CdSe, MgSe, ZnTe, MgTe, or GdTe.

In some embodiments, the stress-reducing layer 164 may be formed of a superlattice of a group IV semiconductor material and a group III-V compound semiconductor material or a superlattice of a group IV semiconductor material and a group II-VI compound semiconductor material. For example, the stress-reducing layer 164 may be formed of a superlattice in which a group IV semiconductor material and a group III-V compound semiconductor material or a group IV semiconductor material and a group II-VI compound semiconductor material are stacked repeatedly, for example, tens of times. In some embodiments, the group IV semiconductor material of the superlattice of the stress-reducing layer 164 may be the same material as that of the fin-shaped active region FA. In some embodiments, the group III-V compound semiconductor material or the group II-VI compound semiconductor material of the superlattice of the stress-reducing layer 164 may be the same as that of the lower end portion 162 and the upper end portion 166. For example, the stress-reducing layer 164 may be formed of a superlattice of a group IV semiconductor material such as Si, Ge, or SiGe and a group III-V compound semiconductor material such as GaSb, AlSb, or InP, or a superlattice of a group IV semiconductor material such as Si, Ge, or SiGe and a group II-VI compound semiconductor material such as CdSe, MgSe, ZnTe, MgTe, or GdTe.

When a lattice constant of the source/drain regions 160 is higher than that of the fin-shaped active region FA, a stress due to a lattice constant difference may be accumulated in the source/drain regions 160 during a process of forming the source/drain regions 160, and thus cracks or crystal defects may occur in the source/drain regions 160. However, in the semiconductor device 200 according to the present embodiment, since the stress-reducing layer 164 is disposed between the lower end portion 162 and the upper end portion 166 of the source/drain regions 160, cracks or crystal defects may be limited and/or prevented from occurring in the source/drain regions 160, thereby improving the reliability of the semiconductor device 200.

The source/drain regions 160 may be vertically and horizontally grown to fill the first recess space RC1, and top surfaces of the source/drain regions 160 may contact parts of the insulating spacers 144. In this case, the source/drain regions 160 may have pentagonal or hexagonal cross-sectional shapes.

Alternatively, the source/drain regions 160a of FIG. 4A or the source/drain regions 160b of FIG. 4B, instead of the source/drain regions 160, may be formed.

Figure 16A:
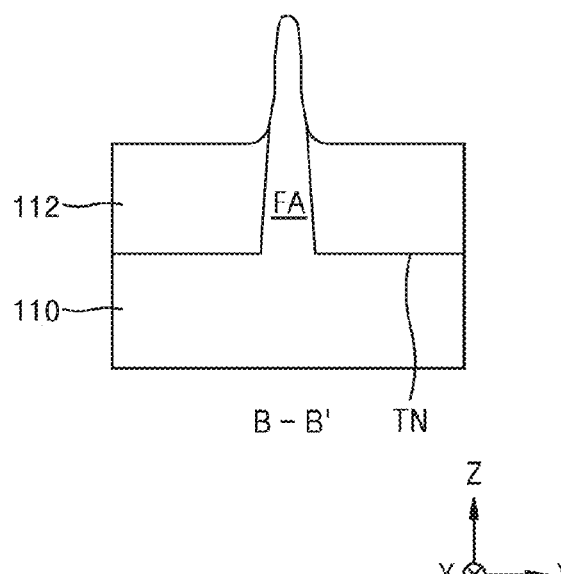
Figure 16B:
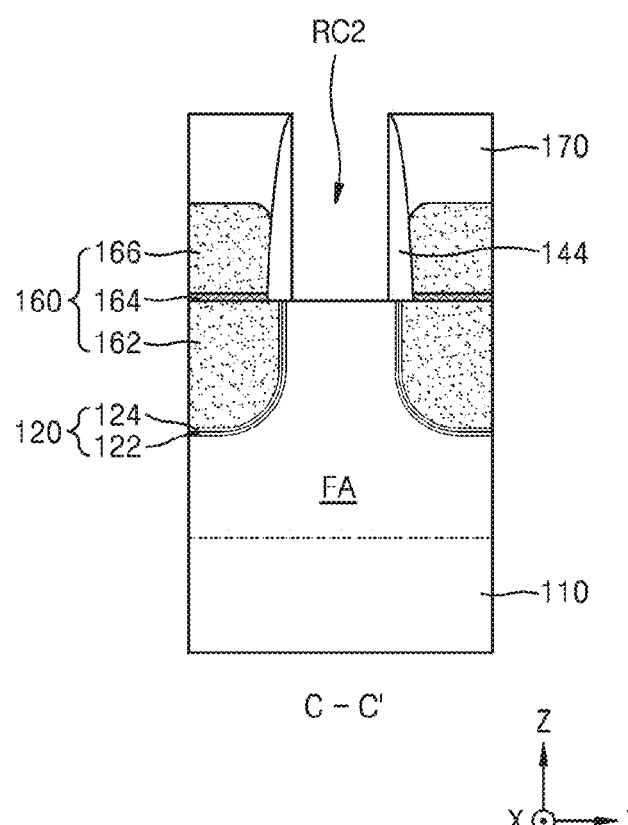

Referring to FIGS. 16A and 16B, the interlayer insulating film 170 that covers the insulating spacers 144 is formed at a side of the insulating spacers 144 opposite to the dummy gate electrode 140D (see FIG. 15). The interlayer insulating film 170 may be formed by forming a pre-interlayer insulating film that covers the source/drain regions 160 and the insulating spacers 144 (see FIG. 15) and planarizing the pre-interlayer insulating film until a top surface of the dummy gate electrode 140D is exposed. In some embodiments, the pre-interlayer insulating film may be formed to include a silicon oxide such as tonen silazene (TOSZ). The planarization may be performed by using a chemical-mechanical polishing (CMP) process and/or an etch-back process.

In some embodiments, due to the planarization for forming the interlayer insulating film 170, upper parts of the insulating spacers 144 and an upper part of the dummy gate electrode 140D may also be removed.

Next, the exposed dummy gate electrode 140D and the dummy gate insulating film 130D (see FIG. 15) disposed under the exposed dummy gate electrode 140D are removed to form a second recess space RC2 that exposes the inner walls of the insulating spacers 144 and the top surface of the fin-shaped active region FA.

Figure 17:
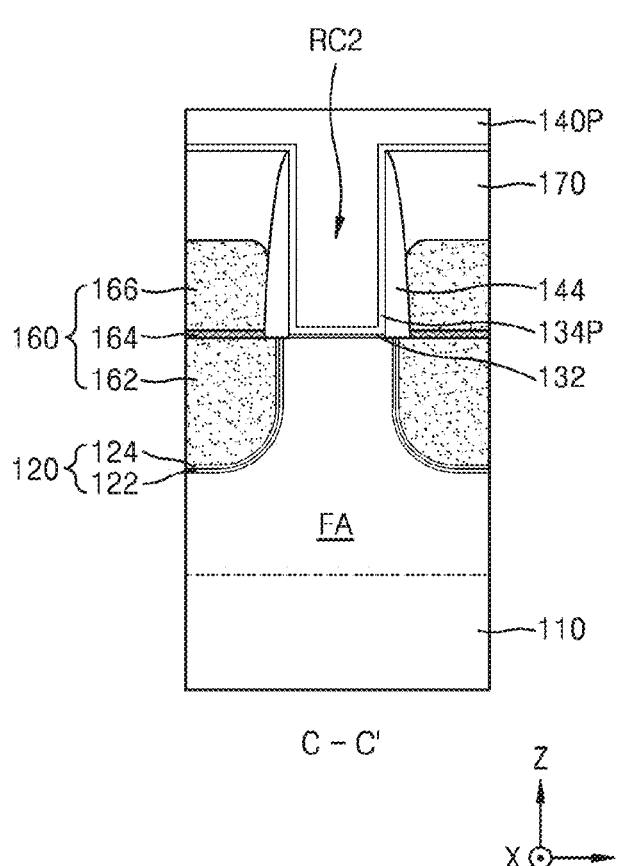

Referring to FIG. 17, the interface film 132 is formed on the exposed top surface of the fin-shaped active region FA. The interface film 132 may be formed of a low-k dielectric material having a relative dielectric constant of about 9 or less, for example, but not limited to, silicon oxide, silicon nitride, silicon oxynitride, gallium oxide, or germanium oxide. The interface film 132 may be an oxide, a nitride, or an oxynitride of a material of the substrate 110. The interface film 132 may have a thickness ranging, for example, but not limited to, from about 5 Å to about 20 Å. The interface film 132 may be formed by using thermal oxidation, ALD, CVD, or PVD.

In some embodiments, the interface film 132 may be formed only on, but not limited to, the top surface of the fin-shaped active region FA that is exposed due to thermal oxidation. For example, when the interface film 132 is formed by using thermal oxidation, ALD, CVD, or PVD, the interface film 132 may be formed on the exposed top surface of the fin-shaped active region FA, the inner walls of the insulating spacers 144, and a top surface of the interlayer insulating film 170.

After the interface film 132 is formed, a high-k dielectric material film 134P that conformably covers a top surface of the interface film 132, the inner walls of the insulating spacers 144, and the top surface of the interlayer insulating film 170 is formed. The high-k dielectric material film 134P may be formed of a high-k dielectric material having a relative dielectric constant ranging from about 10 to about 25 that is higher than that of the interface film 132. The high-k dielectric material film 134P may be formed of a material having a relative dielectric constant that is higher than that of, for example, each of a silicon oxide film and a silicon nitride film. The high-k dielectric material film 134P may be formed of a material selected from among, but not limited to, hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof.

The high-k dielectric material film 134P may be formed by using ALD, CVD, or PVD. The high-k dielectric material film 134P may have a thickness ranging, for example, but not limited to, from about 10 Å to about 40 Å.

Next, a gate electrode material layer 140P that covers the high-k dielectric material film 134P and fills the second recess space RC2 is formed. The gate electrode material layer 140P may be formed of at least one metal selected from among, for example, Ti, Ta, Al, W, Ru, Nb, Mo, Hf, Ni, Co, Pt, Yb, Tb, Dy, Er, and Pd, a metal nitride including at least one metal, or a metal compound such as a carbon-doped metal or a carbon-doped metal nitride.

The gate electrode material layer 140P may include a single film or may have a multi-film structure including a plurality of films. The gate electrode material layer 140P may include, for example, a work function adjusting metal-containing layer and a gap filling metal-containing layer that fills a space formed over the work function adjusting metal-containing layer.

In some embodiments, the gate electrode material layer 140P may have a structure in which a metal nitride layer, a metal layer, a conductive capping layer, and a gap-fill metal film are sequentially stacked. Each of the metal nitride layer and the metal layer may include at least one metal atoms selected from among Ti, W, Ru, Nb, Mo, Hf, Ni, Co, Pt, Yb, Tb, Dy, Er, and Pd. Each of the metal nitride layer and the metal layer may be formed by using ALD, MOALD, or MOCVD. The conductive capping layer may function as a protective film for limiting and/or preventing a surface of the metal layer from being oxidized. Also, the conductive capping layer may function as a wetting layer for easily depositing another conductive layer on the metal layer. The conductive capping layer may be formed of, for example, but not limited to, a metal nitride such as TiN, TaN, or a combination thereof. The gap-fill metal film may extend over the conductive capping layer. The gap-fill metal film may be a W film. The gap-fill metal film may be formed by using ALD, CVD, or PVD. The gap-fill metal film may cover a recess space formed by a stepped portion between regions on a top surface of the conductive capping layer without voids. In some embodiments, the gate electrode material layer 140P may have a TiAlC/TiN/W stacked structure, a TiN/TaN/TiAlC/TiN/W stacked structure, or a TiN/TaN/TiN/TiAlC/TiN/W stacked structure. In the stacked structures, a TiAlC layer or a TiN layer may function as a work function adjusting metal-containing layer.

Next, the gate electrode 140 and the gate insulating film 130 of FIGS. 1A through 1C are formed by performing planarization for removing parts of the gate electrode material layer 140P and the high-k dielectric material film 124P until the interlayer insulating layer 170 is exposed. The gate insulating film 130 may be a portion of the interface film 132 and the high-k dielectric material film 134P in the second recess portion RC2. The gate electrode 140 may be a portion of the gate electrode material layer 140P in the second recess RC2.

In some embodiments, the gate insulating film 130 may be first formed, and then the gate electrode 140 may be formed by forming the gap-fill metal film and/or the conductive capping layer. In this case, the gate insulating film 130 may not be formed on upper portions of the inner walls of the insulating spacers 144. In detail, when parts of the gate electrode material layer 140P and the high-k dielectric material film 134P are removed, remaining parts of the gate electrode material layer 140P and the high-k dielectric material film 134P may fill only a lower part of the second recess RC2 and then the gap-fill metal film and/or the conductive capping layer may fill a remaining space of the second recess RC2, to form the gate electrode 140. In this case, the remaining part of the gate electrode material layer 140P may be the metal nitride layer and the metal layer, or the metal nitride layer, the metal layer, and the conductive capping layer.

FIGS. 18 through 21 are cross-sectional views for explaining a method of manufacturing a semiconductor device according to an embodiment. FIGS. 18 through 21 are cross-sectional views for explaining a method of manufacturing a semiconductor device including a transistor having a FinFET structure. A method of manufacturing the semiconductor device 200a of FIGS. 2A through 2C will now be explained with reference to FIGS. 18 through 21. In detail, FIGS. 18 through 21 are cross-sectional views taken along line B-B' of FIG. 2A. In FIGS. 18 through 21, the same elements as those in FIGS. 2A through 2C are denoted by the same reference numerals, and a detailed explanation thereof will not be given.

Figure 18:
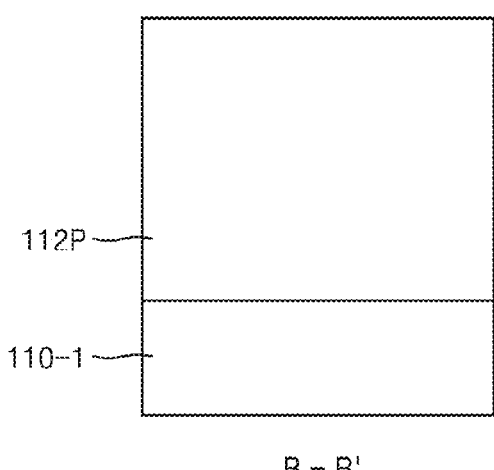
FIGS. 18 through 21 are cross-sectional views for explaining a method of manufacturing a semiconductor device according to an embodiment.
Figure 18:
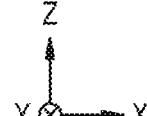

Referring to FIG. 18, the substrate base 110-1 is prepared, and then a pre-device isolation film 112P is formed on the substrate base 110-1. The substrate base 110-1 may be the same as the substrate 110 of FIGS. 1A through 17, and thus a detailed explanation thereof will not be given. In some embodiments, the substrate base 110-1 may be formed of Si. The pre-device isolation film 112P may be formed in the same manner as that used to form the device isolation film 112 of FIG. 7, and thus a detailed explanation thereof will not be given.

Figure 19:
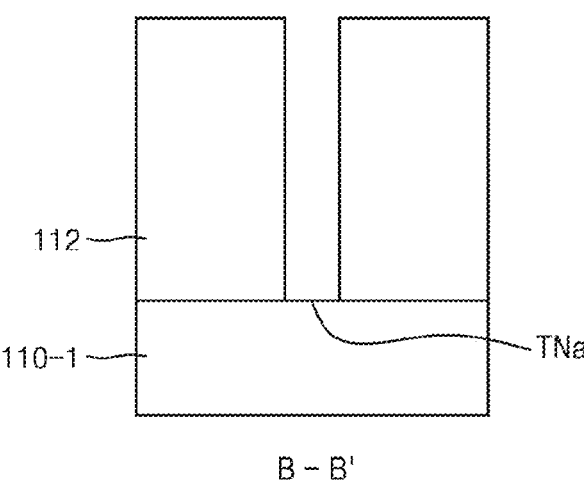

Referring to FIG. 19, the device isolation film 112 having the trench TNa through which a part of the substrate base 110-1 is exposed is formed by etching a portion of the pre-device isolation film 112P (see FIG. 18).

Figure 20:
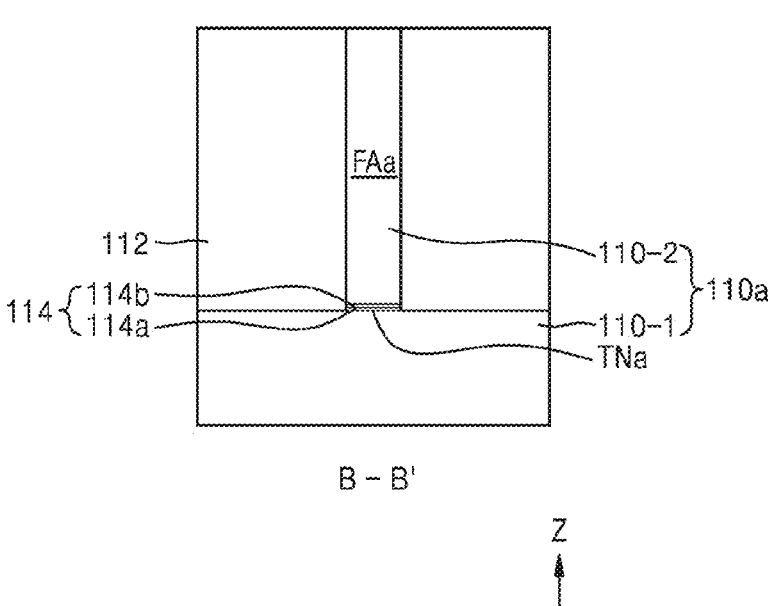

Referring to FIG. 20, the substrate 110a including the substrate base 110-1, the active buffer layer 114, and the fin portion 110-2 is formed by sequentially forming the active buffer layer 114 and the fin portion 110-2 on the substrate base 110-1 that is exposed through a bottom surface of the trench TNa of the device isolation film 112. The fin portion 1100-2 may be formed to fill the trench TNa. In some embodiments, the fin portion 110-2 may be formed of Ge. The fin portion 110-2 may constitute the fin-shaped active region FAa. The fin portion 110-2 may be formed by performing SEG using surfaces of the substrate base 110-1 and the active buffer layer 114 as seeds.

The substrate base 110-1 may be formed of a first semiconductor material and the fin portion 110-2 may be formed of a second semiconductor material. The second semiconductor material may have an electron mobility that is higher than that of the first semiconductor material. The substrate base 110-1 and the fin portion 110-2 may be formed of a group IV semiconductor material. In some embodiments, the first semiconductor material may be Si and the second semiconductor material may be Ge.

The active buffer layer 114 may reduce a lattice mismatch between the substrate base 110-1 and the fin portion 110-2.

The active buffer layer 114 may include the lower active buffer layer 114a formed on the substrate base 110-1 and the upper active buffer layer 114b formed on the lower active buffer layer 114a.

The lower active buffer layer 114a may be formed of a group IV semiconductor material that is amorphous. In some embodiments, the lower active buffer layer 114a may be an amorphous layer of a material composed of (and/or including) the same atoms as those of the substrate base 110-1. In detail, the lower active buffer layer 114a may be an amorphous layer of the same group IV semiconductor material as that of the substrate base 110-1. For example, the lower active buffer layer 114a may be an amorphous layer of a group IV semiconductor material such as Si.

The upper active buffer layer 114b may be formed of a compound semiconductor material composed of (and/or including) atoms of the substrate base 110-1 and atoms of the fin portion 110-2. The upper active buffer layer 114b may be formed of a group IV compound semiconductor material, and may be a grade layer in which an atomic ratio of a compound semiconductor material changes from bottom to top. The upper active buffer layer 114b may be formed so that an overall stoichiometry is constant and a ratio between atoms of the upper active buffer layer 114b changes from bottom to top. For example, from among atoms of a compound semiconductor material of the upper active buffer layer 114b, for example, first atoms and second atoms from different groups, a ratio of the first atoms whose atomic radii are less than those of the second atoms may decrease from bottom to top of the upper active buffer layer 114b and a ratio of the second atoms whose atomic radii are greater than those of the first atoms may increase from bottom to top of the upper active buffer layer 114b. In some embodiments, the first atoms may be Si atoms and the second atoms may be Ge atoms. For example, the upper active buffer layer 114b may include a multi-layer film in which a ratio between the first atoms and the second atoms is, but not limited, 90%: 10%, 80%: 20%, 70%: 30%, 50%: 50%, 30%: 70%, 20%: 80% or 10%: 90% (e.g., in a range from 90%: 10% to 10%: 90%). In some embodiments, the upper active buffer layer 114b may be formed so that a ratio between the first atoms and the second atoms changes continuously.

Figure 21:
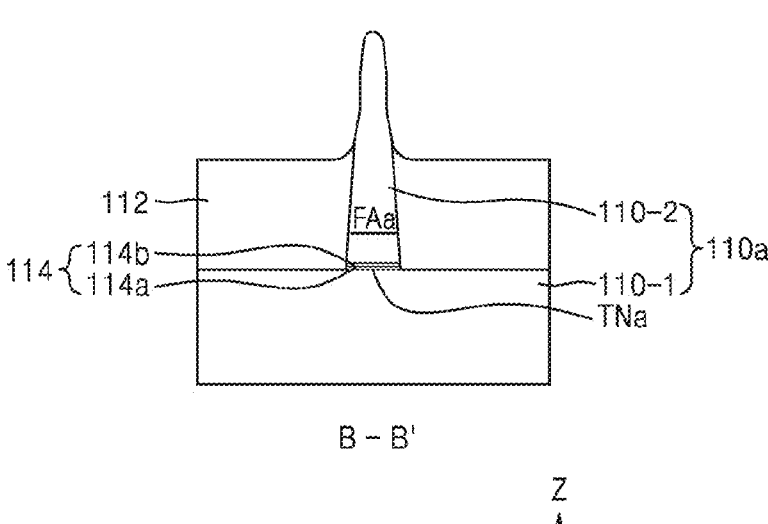

Referring to FIG. 21, a recess process for removing a part of the device isolation film 112 is performed. As a result, a height of a top surface of the device isolation film 112 may be reduced to obtain the fin-shaped active region FAa.

In order to perform the recess process, a dry etching process, a wet etching process, or a combination process thereof may be used.

While the recess process is performed, an exposed upper portion of the fin-shaped active region FAa may be exposed to an etching atmosphere such as plasma, and an exposed surface of the fin-shaped active region FAa may be damaged due to the etching atmosphere or a roughness of the exposed surface of the fin-shaped active region FAa may be degraded. Accordingly, in some embodiments, in order to improve the roughness of the exposed surface of the fin-shaped active region FAa, a wet etching process may be performed or a process of forming and removing a sacrificial oxide film may be performed. In a process of removing a part of the device isolation film 112 or improving the roughness of the exposed surface of the fin-shaped active region FAa, a width of the channel portion CHa (see FIG. 2B) of the fin-shaped active region FAa that is exposed on the top surface of the device isolation film 112 in one direction (e.g., the X direction) may be less than that of the fin-shaped active region FAa of FIG. 20. Also, an upper end of the fin-shaped active region FAa may have a round shape.

In some embodiments, impurity ion implantation for adjusting a threshold voltage may be performed on an upper portion of the fin-shaped active region FAa. During the impurity ion implantation for adjusting the threshold voltage, B ions may be implanted as impurities to form an NMOS transistor and P or As may be implanted as impurities to form a PMOS transistor. The impurity ion implantation for adjusting the threshold voltage may be performed before or after the process of improving the roughness of the exposed surface of the fin-shaped active region FAa is performed.

Next, the semiconductor device 200a of FIGS. 2A through 2C may be formed by performing the method of manufacturing the semiconductor device of FIGS. 9A through 17.

FIGS. 22 through 25 are cross-sectional views for explaining a method of manufacturing a semiconductor device according to an embodiment. FIGS. 22 through 25 are cross-sectional views for explaining a method of manufacturing a semiconductor device including a transistor having a FinFET structure. A method of manufacturing the semiconductor device 200b of FIGS. 3A through 3C will now be explained with reference to FIGS. 22 through 25. In detail, FIGS. 22 through 25 are cross-sectional views taken along line B-B' of FIG. 3A. In FIGS. 22 through 25, the same elements as those in FIGS. 3A through 3C are denoted by the same reference numerals, and a detailed explanation thereof will not be given.

Figure 22:
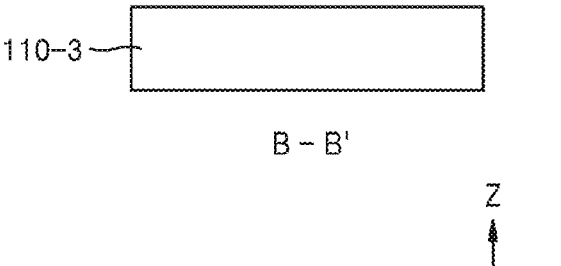
FIGS. 22 through 25 are cross-sectional views for explaining a method of manufacturing a semiconductor device according to an embodiment.

Referring to FIG. 22, the lower substrate base 110-3 is prepared. The lower substrate base 110-3 may be the same as the substrate 110 of FIGS. 1A through 17, and thus a detailed explanation thereof will not be given. In some embodiments, the lower substrate base 110-3 may be formed of Si.

Figure 23:
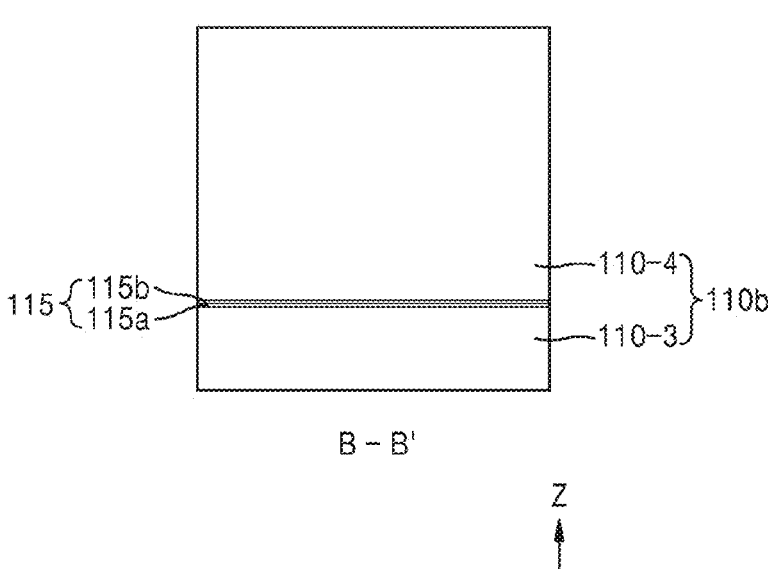

Referring to FIG. 23, the substrate 110b including the lower substrate base 110-3, the substrate buffer layer 115, and the upper substrate base 110-4 is formed by sequentially forming the substrate buffer layer 115 and the upper substrate base 110-4 on the lower substrate base 110-3. In some embodiments, the upper substrate base 110-4 may be formed of Ge. The upper substrate base 110-4 may be formed by performing SEG using surfaces of the lower substrate base 110-3 and the substrate buffer layer 115 as seeds.

The lower substrate base 110-3 may be formed of a first semiconductor material and the upper substrate base 110-4 may be formed of a second semiconductor material. The second semiconductor material may have an electron mobility that is higher than that of the first semiconductor material. The lower substrate base 110-3 and the upper substrate base 110-4 may be formed of a group IV semiconductor material. In some embodiments, the first semiconductor material may be Si and the second semiconductor material may be Ge.

The substrate buffer layer 115 may reduce a lattice mismatch between the lower substrate base 110-3 and the upper substrate base 110-4.

The substrate buffer layer 115 may include the lower substrate buffer layer 115a formed on the lower substrate base 110-3 and the upper substrate buffer layer 115b formed on the lower substrate buffer layer 115a.

The lower substrate buffer layer 115a may be formed of a group IV semiconductor material that is amorphous. In some embodiments, the lower substrate buffer layer 115a may be an amorphous layer of a material composed of (and/or including) the same atoms as those of the lower substrate base 110-3. In detail, the lower substrate buffer layer 115a may be an amorphous layer of the same group IV semiconductor material as that of the lower substrate base 110-3. For example, the lower substrate buffer layer 115a may be an amorphous layer of a group IV semiconductor material such as Si.

The upper substrate buffer layer 115b may be formed of a compound semiconductor material composed of (and/or including) atoms of the lower substrate base 110-3 and atoms of the upper substrate base 110-4. The upper substrate buffer layer 115b may be formed of a group IV compound semiconductor material, and may be a grade layer in which an atomic ratio of a compound semiconductor material changes from bottom to top. The upper substrate buffer layer 115b may be formed so that an overall stoichiometry is constant and a ratio between atoms of the upper substrate buffer layer 115b changes from bottom to top. For example, from among atoms of a compound semiconductor material of the upper substrate buffer layer 115b, for example, first atoms and second atoms from different groups, a ratio of the first atoms whose atomic radii are less than those of the second atoms may decrease from bottom to top of the upper substrate buffer layer 115b and a ratio of the second atoms whose atomic radii are greater than those of the first atoms may increase from bottom to top of the upper substrate buffer layer 115b. In some embodiments, the first atoms may be Si atoms and the second atoms may be Ge atoms. For example, the upper substrate buffer layer 115b may include a multi-layer film in which a ratio between the first atoms and the second atoms is, but not limited, 90%: 10%, 80%: 20%, 70%: 30%, 50%: 50%, 30%: 70%, 20%: 80% or 10%: 90%. In some embodiments, the upper substrate buffer layer 115b may be formed so that a ratio between the first atoms and the second atoms changes continuously.

Figure 24:
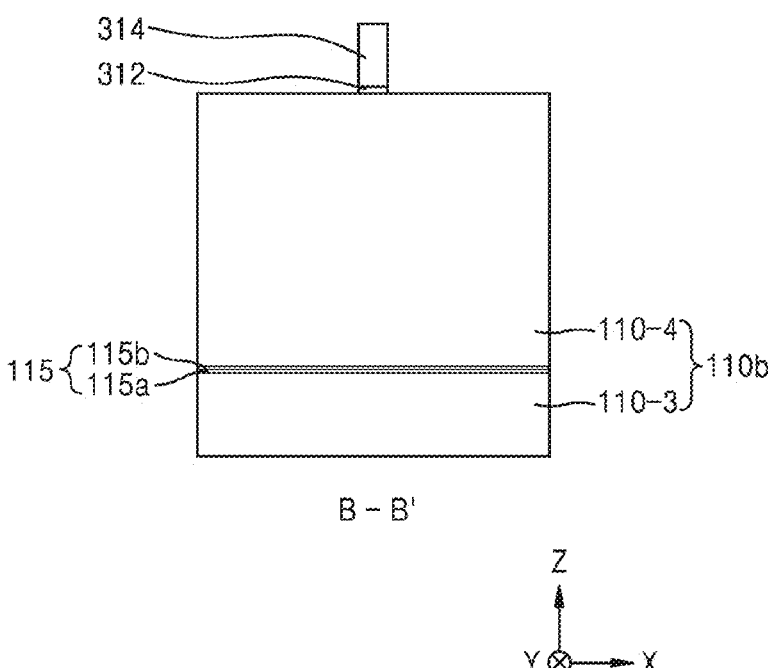

Referring to FIG. 24, the pad oxide film pattern 312 and the first mask pattern 314 are formed on the substrate 110b.

The pad oxide film pattern 312 and the first mask pattern 314 may extend in one direction (e.g., the Y direction) on the substrate 110b.

In some embodiments, the pad oxide film pattern 312 may include an oxide film obtained by thermally oxidizing a surface of the substrate 110b. The first mask pattern 314 may include, but not limited to, a silicon nitride film, a silicon oxynitride film, a SOG film, a SOH) film, a photoresist film, or a combination thereof.

Figure 25:
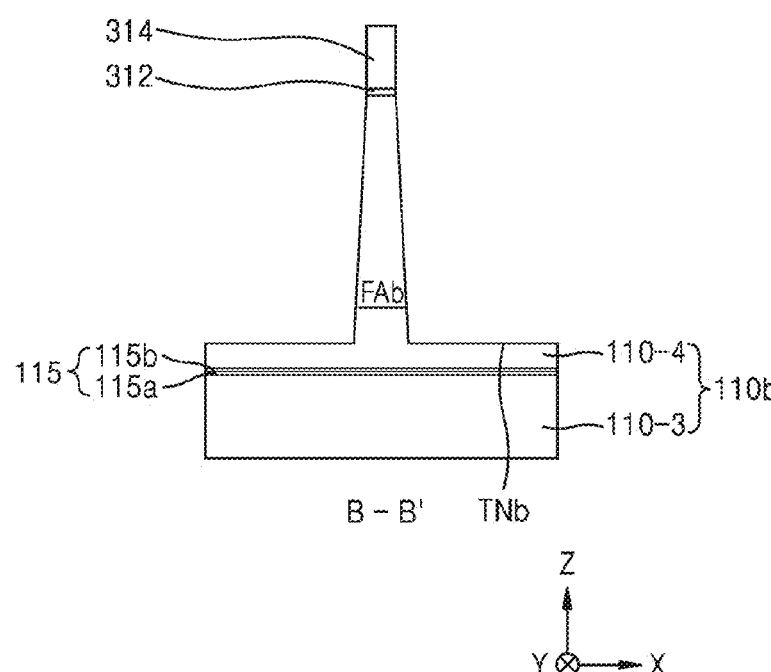

Referring to FIG. 25, the trench TNb is formed in the substrate 110b by etching a portion of the substrate 110b by using the first mask pattern 314 as an etching mask. As the trench TNb is formed, the fin-shaped active region FAb that protrudes from the substrate 110b upward in the direction (e.g., the Z direction) perpendicular to the main surface of the substrate 110b and extends in one direction (e.g., the Y direction) may be obtained. The trench TNb may be formed in the upper substrate base 110-4 of the substrate 110b. For example, the upper substrate base 110-4 may be exposed through a bottom surface of the trench TNb and the substrate buffer layer 115 and the lower substrate base 110-3 may not be exposed.

The semiconductor device 200b of FIGS. 3A through 3B may be formed by performing the method of manufacturing the semiconductor device of FIGS. 7 through 17.

Figure 26:
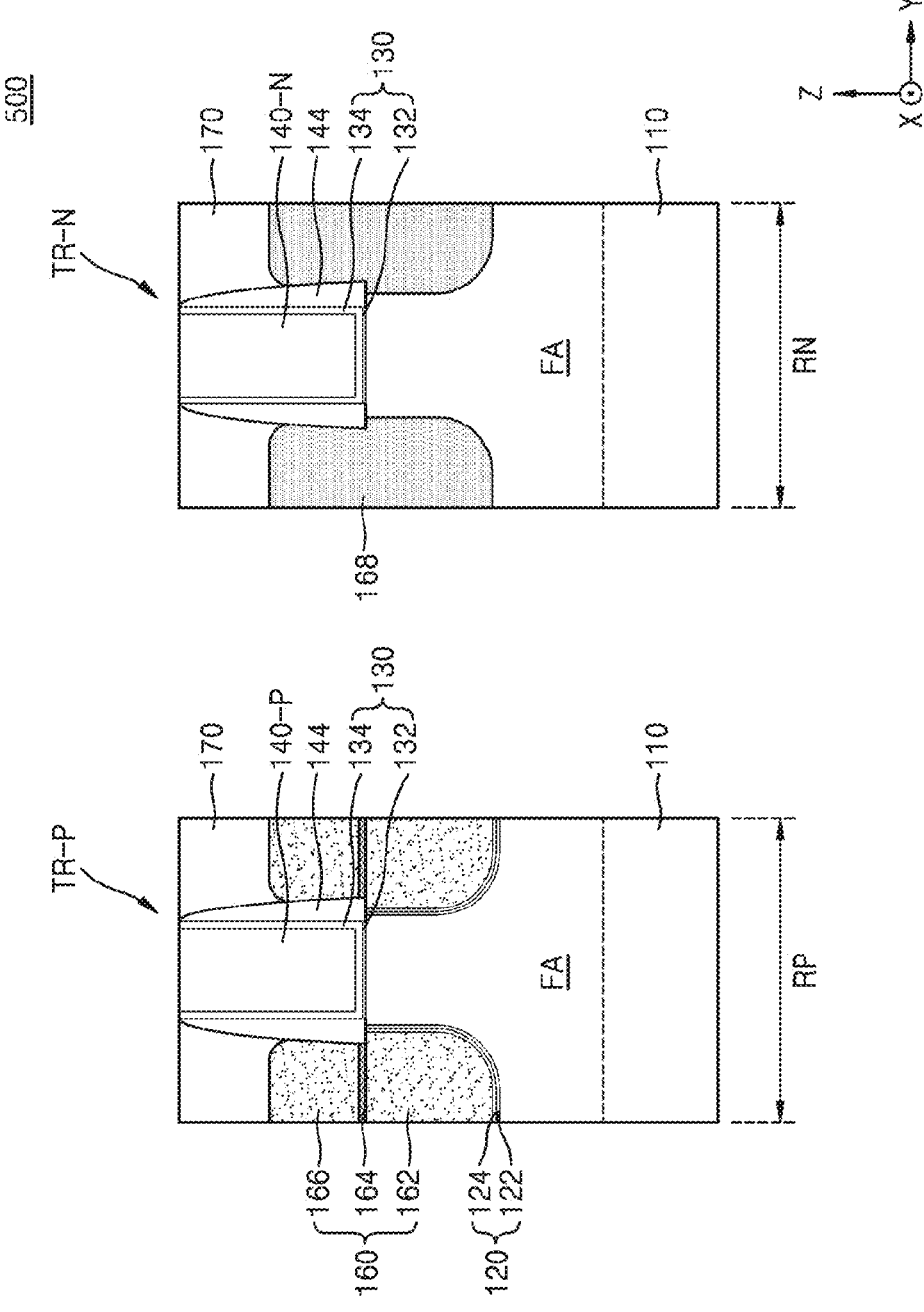
FIG. 26 is a cross-sectional view illustrating elements of a semiconductor device according to an embodiment.

FIG. 26 is a cross-sectional view illustrating elements of a semiconductor device 500 according to an embodiment.

Referring to FIG. 26, the semiconductor device 500 includes the substrate 110 including a first region RP and a second region RN, and a first transistor TR-P and a second transistor TR-N respectively formed in the first region RP and the second region RN.

In some embodiments, the first transistor TR-P may be a PMOS transistor and the second transistor TR-N may be an NMOS transistor.

The first transistor TR-P is the same as the transistor TR of FIGS. 1A through 1C except that a first gate electrode 140-P, instead of the gate electrode 140, is used, and thus a detailed explanation thereof will not be given. In some embodiments, the first gate electrode 140-P may the same as the gate electrode 140 of FIGS. 1A through 1C.

The second transistor TR-N formed in the second region RN may include the fin-shaped active region FA that protrudes from the substrate 110 in a direction (e.g., a Z direction) perpendicular to a main surface of the substrate 110, the gate insulating film 130 that covers a top surface and both side walls of the fin-shaped active region FA, a second gate electrode 140-N that is formed over the top surface and the both side walls of the fin-shaped active region FA to cover the gate insulating film 130, and one pair of source/drain regions 168 that are formed on portions of the fin-shaped active region FA located on both sides of the second gate electrode 140-N.

Hereinafter, the source/drain regions 160 formed in the first region RP are referred to as first source/drain regions 160 and the source/drain regions 168 formed in the second region RN are referred to as second source/drain regions 168.

The one pair of second source/drain regions 168 that are formed in the second region RN and constitute the second transistor TR-N may be formed of a group IV semiconductor material. The one pair of second source/drain regions 168 may include a semiconductor layer that is epitaxially grown from the fin-shaped active region FA. The one pair of second source/drain regions 168 may include a Si layer that is epitaxially grown or a SiC layer that is epitaxially grown.

In the semiconductor device 500, the first source/drain regions 160 that constitute the first transistor TR-P may be formed of a compound semiconductor material from different groups and the second source/drain regions 168 that constitute the second transistor TR-N may be formed of a group IV semiconductor material. Accordingly, when the first transistor TR-P is a PMOS transistor and the second transistor TR-N is an NMOS transistor, a mobility of holes in the first transistor TR-P that is a PMOS transistor may be increased, and thus an operation speed of a CMOS semiconductor device including the first transistor TR-P and the second transistor TR-N may be increased.

Although not shown in FIG. 26, the transistor TRa of FIGS. 2A through 2C and/or the transistor TRb of FIGS. 3A through 3B may be used by forming the substrate 110*a* of FIGS. 2A through 2B or the substrate 110*b* of FIGS. 3A through 3B, instead of the substrate 110, in the first region RP.

Figure 27:
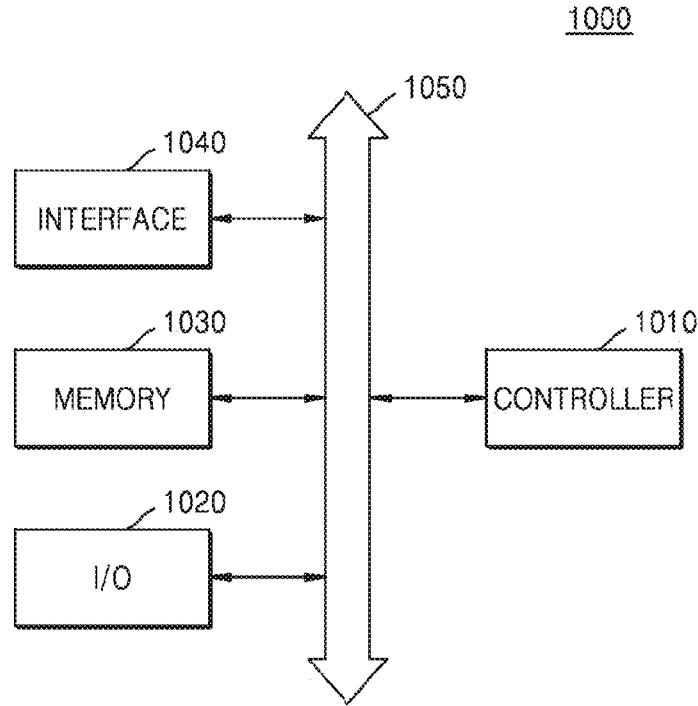
FIG. 27 is a block diagram of an electronic system according to an embodiment.

FIG. 27 is a block diagram of an electronic system 1000 according to an embodiment.

Referring to FIG. 27, the electronic system 1000 includes a controller 1010, an input/output (I/O) device 1020, a memory 1030, and an interface 1040, which are connected to one another via a bus 1050.

The controller 1010 may include at least one of a microprocessor, a digital signal processor, and a similar processor. The I/O device 1020 may include at least one of a keypad, a keyboard, and a display. The memory 1030 may be used to store a command that is executed by the controller 1010. For example, the memory 1030 may be used to store user data.

The electronic system 1000 may constitute a wireless communication apparatus or an apparatus for wirelessly transmitting and and/or receiving information. In order for the electronic system 1000 to transmit/receive data through a wireless communication network, the interface 1040 may be a wireless interface. The interface 1040 may include an antenna and/or a wireless transceiver. In some embodiments, the electronic system 1000 may be used in a communication interface protocol of a third generation communication system such as code division multiple access (CDMA), global system for mobile communications (GSM), north American digital cellular (NADC), extended-time division multiple access (E-TDMA), and/or wide band code division multiple access (WCDMA). The electronic system 1000 includes at least one of the semiconductor devices of FIGS. 1A through 26 and semiconductor devices manufactured by using the methods of manufacturing the semiconductor devices and various modifications of the methods within the scope of inventive concepts.

According to a semiconductor device of the one or more embodiments, since one pair of source/drain regions are formed of a material having a lattice constant that is higher than that of a fin-shaped active region, a compressive stress is applied to a channel portion of the fin-shaped active region, and thus a mobility of holes in the source/drain regions may be increased. Accordingly, an operation speed of a transistor of the semiconductor device may be increased.

Also, since the source/drain regions include a stress-reducing layer disposed between a lower end portion and an upper end portion, cracks or crystal defects may be limited and/or prevented from occurring in the source/drain regions, thereby improving the reliability of the semiconductor device.

Also, since a buffer layer is formed between the fin-shaped active region and the source/drain regions, a lattice mismatch between the fin-shaped active region and the source/drain regions may be reduced and the crystallinity of the source/drain regions may be improved during a process of forming the source/drain regions.

Descriptions of features or aspects within each device or method according to example embodiments should typically be considered as available for other similar features or aspects in other devices or methods according to example embodiments. While inventive concepts have been particularly shown and described with reference to the above-discussed embodiments, it will be understood that various changes in form and details may be made therein without departing from the spirit and scope of the following claims.

What is claimed is:

1. A semiconductor device comprising:
   a substrate;
   a channel region including a fin-shaped active region and a nanosheet stacked structure on the fin-shaped active region, the fin-shaped active region protruding from the substrate and including silicon;
   a gate electrode surrounding the channel region;
   one pair of source/drain regions on the fin-shaped active region, the one pair of source/drain regions including a source/drain compound semiconductor material including source/drain atoms from different groups; and
   a lower buffer layer between the fin-shaped active region and the source/drain regions, the lower buffer layer including a lower buffer compound semiconductor material that is amorphous and includes lower buffer atoms from different groups.

2. The semiconductor device of claim 1, wherein the lower buffer atoms of the lower buffer compound semiconductor material of the lower buffer layer includes a same type of atoms as the source/drain atoms of the source/drain compound semiconductor material of the one pair of source/drain regions.

3. The semiconductor device of claim 1, further comprising:
   an upper buffer layer between the lower buffer layer and the source/drain regions, wherein
   the upper buffer layer includes an upper buffer compound semiconductor material including first atoms from a first group and second atoms from a second group different from the first groups, the second atoms have greater atomic radii than the first atoms, and a ratio of the first atoms to the second atoms decreases from bottom to top of the upper buffer layer.

4. The semiconductor device of claim 3, wherein the first and second atoms of the upper buffer compound semiconductor material of the upper buffer layer includes a same type of atoms as the source/drain atoms of the source/drain compound semiconductor material of the source/drain regions.

5. The semiconductor device of claim 1, wherein the one pair of source/drain regions includes a lower end portion that includes a crystalline material, an upper end portion that includes a crystalline material, and a stress-reducing layer between the lower end portion and the upper end portion, and the stress-reducing layer includes an amorphous material.

6. The semiconductor device of claim 1, wherein the one pair of source/drain regions includes a lower end portion that includes a crystalline material, an upper end portion that includes a crystalline material, and a stress-reducing layer located between the lower end portion and the upper end portion, and the stress-reducing layer includes a superlattice of a group IV semiconductor material.

7. The semiconductor device of claim 1, wherein the substrate includes a substrate base and a lower active buffer layer, the substrate base includes a first semiconductor material, the fin-shaped active region is on the substrate base, the fin-shaped active region includes a second semiconductor material having an electron mobility that is higher than an electron mobility of the first semiconductor material, the lower active buffer layer is located between the substrate base and the fin-shaped active region, and the lower active buffer layer includes the first semiconductor material and is amorphous.

8. The semiconductor device of claim 7, wherein the substrate further includes an upper active buffer layer located between the lower active buffer layer and the fin-shaped active region, the upper active buffer layer includes an upper buffer compound semiconductor material including upper buffer atoms of a same type as first semiconductor atoms of the first semiconductor material and second semiconductor atoms of the second semiconductor material, and in the upper active buffer layer, a ratio of the first semiconductor atoms of the first semiconductor material to the second semiconductor atoms of the second semiconductor material decreases from bottom to top of the upper active buffer layer.

9. The semiconductor device of claim 1, wherein the substrate includes a lower substrate base and an upper substrate base, the lower substrate base includes a first semiconductor material, the upper substrate base is on the lower substrate base, the upper substrate is-base includes a second semiconductor material having an electron mobility that is higher than an electron mobility of the first semiconductor material, and the upper substrate base includes the fin-shaped active region.

10. The semiconductor device of claim 9, further comprising:

a lower substrate buffer layer located between the lower substrate base and the upper substrate base, wherein the lower substrate buffer layer includes the first semiconductor material and is amorphous.

11. The semiconductor device of claim 10, further comprising:

an upper substrate buffer layer located between the lower substrate buffer layer and the upper substrate base, wherein the upper substrate buffer layer includes an upper substrate buffer compound semiconductor material including upper substrate buffer atoms of a same type as first semiconductor atoms of the first semiconductor material and second semiconductor atoms of the second semiconductor material, and in the upper substrate buffer layer, a ratio of the first semiconductor atoms of the first semiconductor material to the second semiconductor atoms of the second semiconductor material decreases from bottom to top of the upper substrate buffer layer.

12. A semiconductor device comprising:

a substrate including a first region and a second region;

a channel region including a fin-shaped active region and a nanosheet stacked structure on the fin-shaped active region, the fin-shaped active region including germanium and protruding from each of the first region and the second region of the substrate;

a gate electrode covering the channel region in each of the first region and the second region of the substrate;

one pair of first source/drain regions on the fin-shaped active region in the first region, the one pair of first source/drain regions including a group III-V compound semiconductor material or a group II-VI compound semiconductor material having a lattice constant that is higher than a lattice constant of the group IV semiconductor material of the fin-shaped active region;

one pair of second source/drain regions on the fin-shaped active region in the second region, the one pair of second source/drain regions including a group IV semiconductor material; and a buffer layer located between the fin-shaped active region and the one pair of first source/drain regions, the buffer layer including an upper buffer layer on a lower buffer layer, wherein the lower buffer layer including a group III-V compound semiconductor material or a group II-VI compound semiconductor material that is amorphous, and the upper buffer layer including a compound semiconductor material including first atoms and second atoms from different groups, the second atoms having greater atomic radii than the first atoms, a ratio of the first atoms to the second atoms decreases from bottom to top of the upper buffer layer.

13. The semiconductor device of claim 12, wherein each of the one pair of first source/drain regions includes a lower end portion, a stress-reducing layer, and an upper end portion, the lower end portion includes a crystalline material, the upper end portion includes a crystalline material, the stress-reducing layer is between the lower end portion and the upper end portion, and the stress-reducing layer includes one of a group III-V compound semiconductor material that is amorphous, a group II-VI compound semiconductor material that is amorphous, a superlattice of a group III-V compound semiconductor material and a group IV semiconductor material, and a superlattice of a group II-VI compound semiconductor material and a group IV semiconductor material.

14. The semiconductor device of claim 13, wherein the lower end portion of each of the one pair of first source/drain regions includes a compound semiconductor material in which a ratio between the first atoms and the second atoms is constant, and the lower buffer layer is an amorphous layer of a compound semiconductor material including the first atoms and the second atoms.

15. The semiconductor device of claim 12, wherein each of the second source/drain regions includes one of silicon (Si) and silicon carbide (SiC).

16. A semiconductor device comprising:

a channel region including a fin-shaped active region that extends in a first direction and a nanosheet stacked structure on the fin-shaped active region, the fin-shaped active region including silicon or germanium;

a source region and a drain region spaced apart from each other on the fin-shaped active region, the source region and the drain region each including a source/drain compound semiconductor material including source/drain atoms from different groups;

a lower buffer layer between the fin-shaped active region and the source region and the drain region, the lower buffer layer including a lower buffer compound semiconductor material that is amorphous and includes lower buffer atoms from different groups; and a gate structure covering the channel region between the source region and the drain region, the gate structure extending in a second direction that crosses the first direction.

17. The semiconductor device of claim 16, further comprising:

a pair of insulating spacers on a portion of the fin-shaped active region between the source region and the drain region, wherein the portion of the fin-shaped active region extends between the source region and the drain region, the pair of insulating spacers cover both sides of the gate structure, and the gate structure includes a gate electrode on a gate insulating film.

18. The semiconductor device of claim 17, further comprising:

a substrate base;

an active buffer layer on the substrate base, wherein the active buffer layer extends in the first direction, the fin-shaped active region is on the active buffer layer, the active buffer layer includes an upper active buffer layer on a lower active buffer layer, and the lower active buffer layer includes a lower active buffer compound semiconductor material that is amorphous.

19. The semiconductor device of claim 17, wherein the source region and the drain region includes a lower end portion that includes a crystalline material, an upper end portion that includes a crystalline material, and a stress-reducing layer between the lower end portion and the upper end portion, and the stress-reducing layer of the source region and the drain region includes an amorphous material.

20. The semiconductor device of claim 16, wherein the lower buffer atoms of the lower buffer compound semiconductor material of the lower buffer layer are a same type of atom as the source/drain atoms as the source/drain compound semiconductor material of the source region and the drain region.

* * * * *